US008870516B2

(12) United States Patent
Bonora

(10) Patent No.: US 8,870,516 B2
(45) Date of Patent: Oct. 28, 2014

(54) PORT DOOR POSITIONING APPARATUS AND ASSOCIATED METHODS

(75) Inventor: Anthony C Bonora, Portola Valley, CA (US)

(73) Assignee: Brooks Automation, Inc., Chelmsford, MA (US)

( * ) Notice: Subject to any disclaimer, the term of this patent is extended or adjusted under 35 U.S.C. 154(b) by 86 days.

(21) Appl. No.: 12/828,236

(22) Filed: Jun. 30, 2010

(65) Prior Publication Data

US 2012/0000816 A1   Jan. 5, 2012

(51) Int. Cl.
*B65G 65/34* (2006.01)
*H01L 21/677* (2006.01)

(52) U.S. Cl.
CPC ....... *H01L 21/67772* (2013.01); *Y10S 414/135* (2013.01)
USPC .............................. 414/411; 49/504; 414/935

(58) Field of Classification Search
USPC ............. 414/411, 935; 206/710; 49/125, 506, 49/404, 501, 503, 504
See application file for complete search history.

(56) References Cited

U.S. PATENT DOCUMENTS

| 659,699 | A | * | 10/1900 | Roundtree | 49/101 |
| 4,367,915 | A | * | 1/1983 | Georges | 359/385 |
| 5,302,120 | A | | 4/1994 | Durado | |
| 6,082,949 | A | * | 7/2000 | Rosenquist | 414/217 |
| 6,106,213 | A | | 8/2000 | Denker | |
| 6,109,395 | A | * | 8/2000 | Storm | 187/200 |
| 6,178,361 | B1 | * | 1/2001 | George et al. | 700/213 |
| 6,443,686 | B1 | * | 9/2002 | Wiesler et al. | 414/590 |
| 6,883,274 | B2 | * | 4/2005 | Webb et al. | 49/293 |
| 7,523,769 | B2 | | 4/2009 | Miyajima et al. | |
| 2006/0088406 | A1 | | 4/2006 | Miyajima et al. | |

FOREIGN PATENT DOCUMENTS

| JP | 2009-070868 A | 4/2009 |
| KR | 10-2006-0012862 | 2/2006 |
| KR | 10-0744349 B1 | 7/2007 |

OTHER PUBLICATIONS

International Search Report and Written Opinion for PCT/US/2011/042455, mailed Feb. 20, 2012.

* cited by examiner

*Primary Examiner* — Saul Rodriguez
*Assistant Examiner* — Glenn Myers
(74) *Attorney, Agent, or Firm* — Martine Penilla Group, LLP

(57) ABSTRACT

A loadport has a port door and a frame with an opening through which the port door interfaces with a container door of a container for holding semiconductor workpieces. In one embodiment, a movable closure mechanism is connected to the port door and is defined to be movable in a controlled manner relative to both the port door and the frame. In this embodiment, a stationary closure mechanism is disposed on the frame proximate to the opening. In another embodiment, a stationary closure mechanism is connected to the port door, and a movable closure mechanism is disposed on the frame proximate to the opening. In both embodiments, the movable closure mechanism is defined to engage with the stationary closure mechanism such that movement of the movable closure mechanism to engage with the stationary closure mechanism applies a closing force between the port door and the container door.

28 Claims, 15 Drawing Sheets

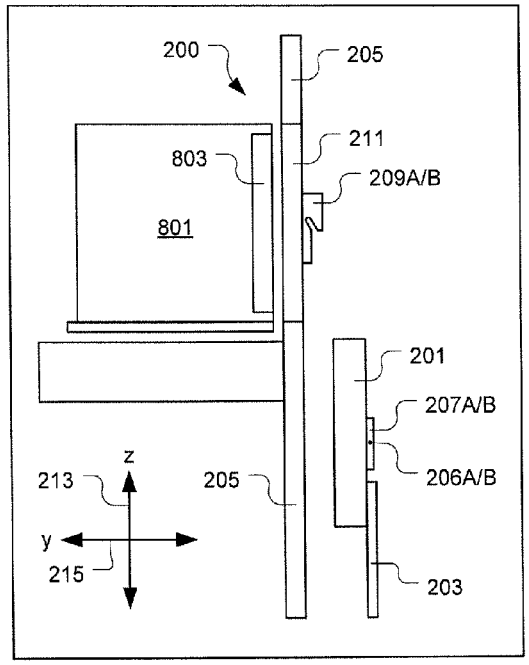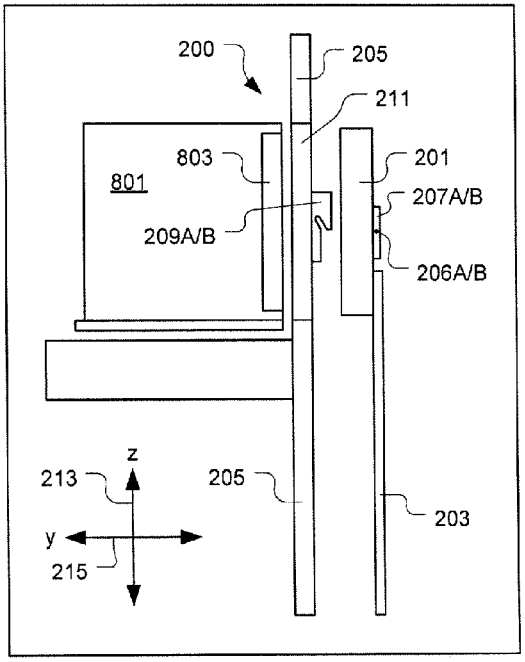
Fig. 8A  Fig. 8B
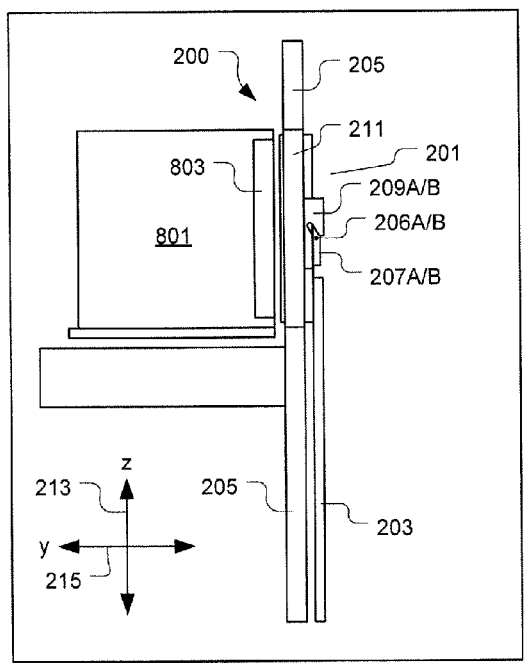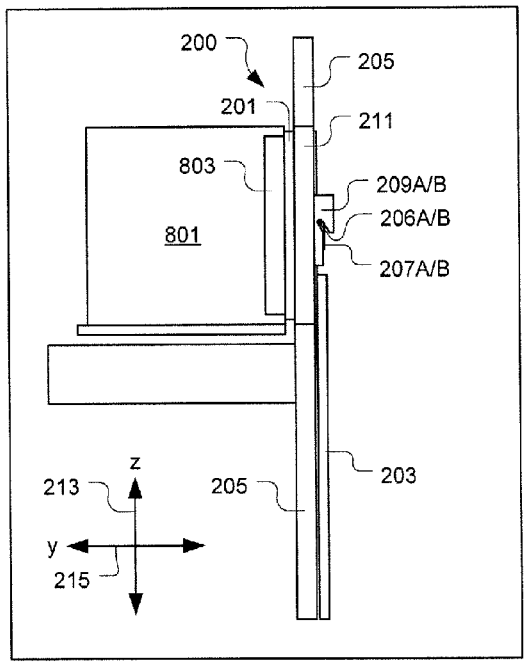
Fig. 8C  Fig. 8D

PORT DOOR POSITIONING APPARATUS AND ASSOCIATED METHODS

BACKGROUND

During semiconductor manufacturing, a semiconductor wafer undergoes a plurality of process steps, each of which are performed by a specialized process tool. Pods are used to convey semiconductor wafers from one tool to another. An exemplary type of pod is referred to as a front-opening unified pod (FOUP). Each pod is capable of transporting a number of wafers of a specific diameter. For example, for wafers of 300 mm, a conventional FOUP has a capacity of 25 wafers, and can therefore carry 25 or fewer 300 mm wafers at a time. For wafers of 450 mm, a FOUP capacity of 25 wafers may also be used, but this FOUP size could be larger to accommodate the larger wafer diameter/thickness and the correspondingly larger wafer stack height within the FOUP. The pods are designed to maintain a protected internal environment to keep the wafers free of contamination, e.g., by particulates in the air outside the pod. Pods are also known for conveying other types of substrates, such as liquid crystal panels, rigid magnetic media for hard disk drives, solar cells, etc.

FIG. 1 shows a conventional loadport 10 configured to interface with a standard 300 mm, 25-wafer pod 70. Loadport 10 is attached to a front end of a process tool as described, for example, with reference to FIGS. 1 and 2 of U.S. Pat. No. 6,502,869, which issued Jan. 7, 2003 to Rosenquist et al., and is incorporated herein by reference in its entirety. For purposes of description, the "front" of loadport 10 is the side of loadport 10 facing the positive Y direction as indicated by coordinate axes 21. The "front" of pod 70 is the side facing the front of loadport 10.

Loadport 10 includes a tool interface 20. In the semiconductor industry, tool interface 20 is often in conformance with an industry standard referred to as "Box Opener/Loader-to-Tool Standard Interface" (BOLTS), commonly referred to as a BOLTS interface or a BOLTS plate. Tool interface 20 includes an aperture 22, i.e., opening. Aperture 22 is substantially occluded by a port door 30. Port door 30 forms a proximity seal with a boundary of aperture 22 to prevent contaminates from migrating to the interior 40 of the process tool. A proximity seal provides a small amount of clearance, e.g., about 1 mm, between the parts forming the proximity seal. The small clearance of the proximity seal allows air at a higher pressure to escape from the interior 40 of the process tool and sweep away any particulates from the sealing surfaces of the proximity seal.

Loadport 10 also includes an advance plate assembly 50 having an advance plate 52. In one embodiment, registration pins (not shown) mate with corresponding slots or recesses in the bottom support 72 of pod 70, to facilitate alignment of the pod 70 on the advance plate 52. Pod 70 may conform to industry standards for Front Opening Unified Pods (FOUPs) or a different standard. Advance plate assembly 50 has an actuator (not shown) that slides advance plate 52 in the Y direction between the retracted position shown in FIG. 1 and an advanced position that brings pod 70 into close proximity with tool interface 20.

A front surface 34 of port door 30 includes a pair of latch keys 60. Latch keys 60 include a post that extends away from port door 30 and is substantially perpendicular to port door 30, and a crossbar at the distal end of the post. The crossbar extends perpendicularly to the post to form a "T" therewith. Port door 30 includes an actuator that interacts with latch keys 60, causing latch keys 60 to rotate on the axis of the post. When the pod 70 moves to the advanced position and the port door 30 moves into the aperture 22, latch keys 60 are inserted into corresponding latch key receptacles 61 of pod door 74. Latch keys 60 are then rotated on the axis of the post, thereby interacting with a mechanism internal to pod door 74, causing pod door 74 latches to disengage from flange 75 of pod 70. An example of a door latch assembly within a pod door adapted to receive and operate with latch keys is disclosed in U.S. Pat. No. 4,995,430, entitled "Sealable Transportable Container Having Improved Latch Mechanism," which is incorporated herein by reference. Another example is presented in U.S. Pat. No. 6,502,869, issued on Jan. 7, 2003 to Rosenquist et al., also incorporated herein by reference.

In addition to disengaging pod door 74 from the pod 70, rotation of the latch keys 60 locks the keys 60 in their respective latch key receptacles, thereby coupling the pod door 74 to the port door 30. A conventional loadport includes two latch keys 60, that are structurally and operationally identical to each other. Additionally, alignment pins 36 are provided to facilitate alignment between port door 30 and pod door 74, so that pod door 74 will be sufficiently aligned to enable passage through the aperture 22 toward the process tool interior 40.

In the conventional loadport 10, the port door 30 is connected to an arm 32. A position of the arm 32 is controlled by a movement mechanism that provides for movement of the arm 32 and port door 30 connected thereto in a vertical direction, as indicated by arrows 35, and in a horizontal direction toward/away from the tool interface 20, as indicated by arrows 33. By way of the arm 32 movement, the port door 30 can be moved through the aperture 22 to engage with/disengage from the pod door 74. Also, when the port door 30 is engaged with the pod door 74, the arm 32 can be moved to bring the port door 30/pod door 74 combination horizontally into the process tool interior 40, and vertically downward to clear the aperture 22 for access to workpieces 25 within the pod 70. In a complementary manner, the arm 32 can be moved to move the port door 30/pod door 74 combination through the aperture 22 so as to replace the pod door 74 within the flange 75 of the pod 70.

SUMMARY

In one embodiment, a loadport is disclosed. The loadport includes a port door having a front surface, a back surface, and first and second vertical side surfaces. The front surface of the port door is defined to interface with a container door of a container for holding semiconductor workpieces, when present. The loadport includes a frame defined to have an opening through which the port door interfaces with the container door. The loadport also includes a positioning device connected to the port door to provide for controlled positioning and movement of the port door. A movable closure mechanism is connected to the back surface of the port door so as to extend outwardly beyond each of the first and second vertical side surfaces of the port door. The movable closure mechanism is defined to be movable in a controlled manner relative to both the port door and the frame. A stationary closure mechanism is disposed on the frame proximate to the opening of the frame and is defined to engage with the movable closure mechanism. Movement of the movable closure mechanism to engage with the stationary closure mechanism applies a closing force between the front surface of the port door and the container door.

In another embodiment, a loadport is disclosed. The loadport includes a port door having a front surface, a back surface, and first and second vertical side surfaces. The front surface of the port door is defined to interface with a container door of a container for holding semiconductor workpieces, when present. The loadport includes a frame defined to have an opening through which the port door interfaces with the container door. The loadport also includes a positioning device connected to the port door to provide for controlled positioning and movement of the port door. A stationary closure mechanism is connected to the back surface of the port door so as to extend outwardly beyond each of the first and second vertical side surfaces of the port door. A movable closure mechanism is disposed on the frame proximate to the opening of the frame and is defined to engage with the stationary closure mechanism. The movable closure mechanism is defined to be movable in a controlled manner relative to both the frame and the port door. Movement of the movable closure mechanism to engage with the stationary closure mechanism applies a closing force between the front surface of the port door and the container door.

In another embodiment, a method is disclosed for operating a loadport. The method includes an operation for positioning a port door within an opening of a frame. A container door of a container for holding semiconductor workpieces is secured to a front surface of the port door. Positioning of the port door within the opening of the frame corresponds to positioning of the container door within a door opening of the container. The method also includes an operation for moving a movable closure mechanism connected to the port door in a first direction without moving the port door in the first direction. In this manner, the movable closure mechanism is moved to engage with a stationary closure mechanism fixed to the frame. Movement of the movable closure mechanism to engage with the stationary closure mechanism applies a closing force between the front surface of the port door and the container door. The method further includes an operation for securing the container door to the container while the closing force is applied between the front surface of the port door and the container door.

In another embodiment, a method is disclosed for operating a loadport. The method includes an operation for positioning a port door within an opening of a frame. A container door of a container for holding semiconductor workpieces is secured to a front surface of the port door. Positioning of the port door within the opening of the frame corresponds to positioning of the container door within a door opening of the container. The method also includes an operation for moving a movable closure mechanism connected to the frame in a first direction without moving the port door or the frame in the first direction. In this manner, the movable closure mechanism is moved to engage with a stationary closure mechanism fixed to the port door. Movement of the movable closure mechanism to engage with the stationary closure mechanism applies a closing force between the front surface of the port door and the container door. The method further includes an operation for securing the container door to the container while the closing force is applied between the front surface of the port door and the container door.

Other aspects and advantages of the invention will become more apparent from the following detailed description, taken in conjunction with the accompanying drawings, illustrating by way of example the present invention.

BRIEF DESCRIPTION OF THE DRAWINGS

FIGS. 8A-8D illustrate operational sequences of the loadport of FIG. 2A, in accordance with one embodiment of the present invention.

DETAILED DESCRIPTION

Figure 1:
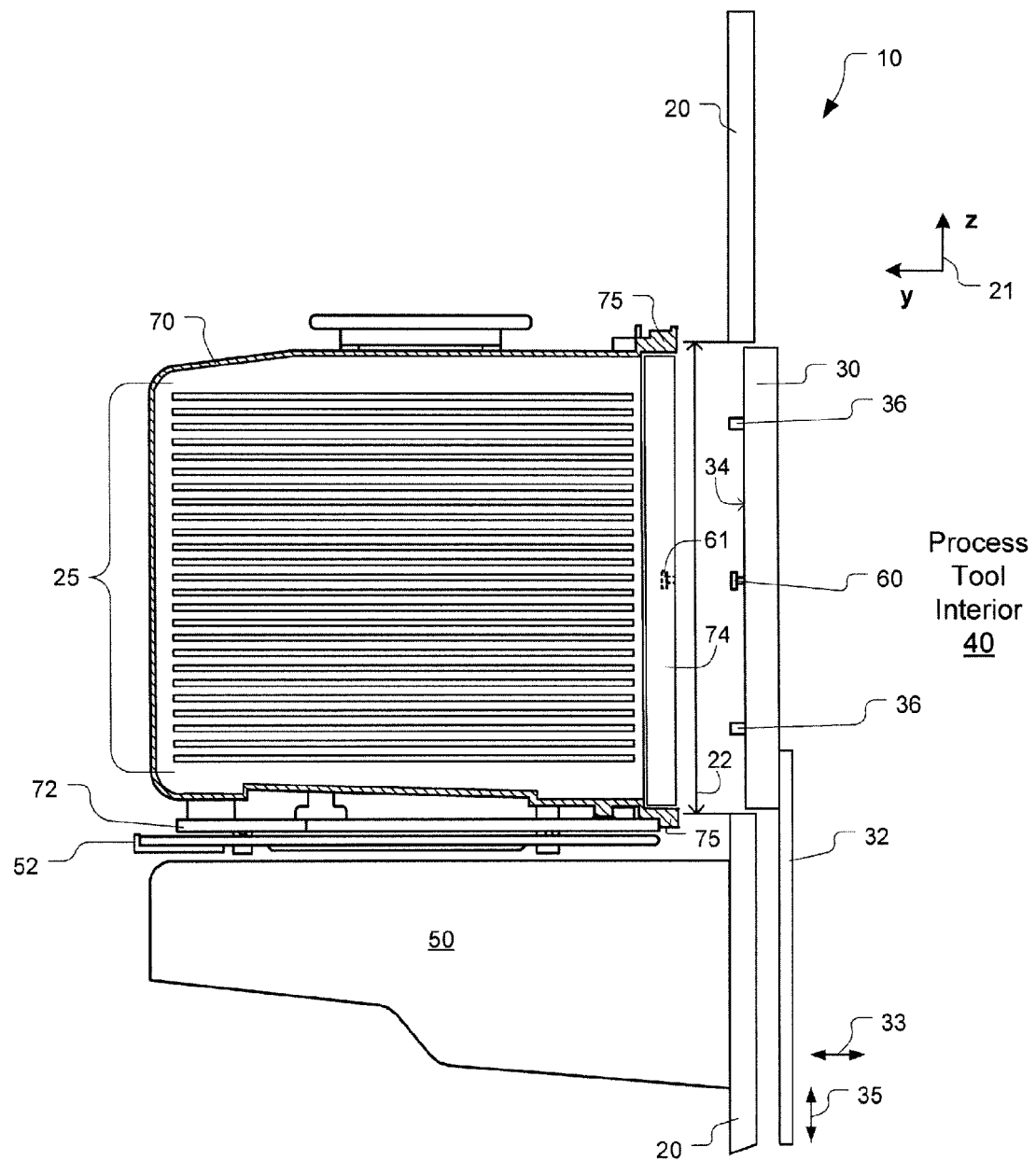
FIG. 1 shows a conventional loadport configured to interface with a standard 25-wafer pod.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Various embodiments of a loadport for a process tool are disclosed herein. Each embodiment of the loadport disclosed herein is equipped with a port door positioning apparatus defined to apply increased force between the port door and a container door of a container, e.g., FOUP, positioned on the loadport. Any loadport embodiment disclosed herein can be used with essentially any process tool, and is specifically suited for use with a process tool requiring a clean process tool interior environment. For instance, in one embodiment, the loadport can be used to provide an access portal to a semiconductor fabrication process tool. In this embodiment, the loadport is configured to receive, support, and manipulate a container defined to house a number of workpieces, such that workpieces can be retrieved from or placed into the container by a robotic handler within the process tool without compromising a cleanliness of the process tool interior. Each workpiece can represent essentially any type of article formed through the semiconductor fabrication process. For example, a workpiece may represent a semiconductor wafer, a flat panel display, a solar panel, among many others. For ease of description, the term "workpiece" is used herein to refer to any type of article to be received into or retrieved from a process tool.

The container defined to interface with the loadport embodiments disclosed herein can be essentially any type of container defined to house a number of workpieces and equipped with a mechanically openable container door. For example, the container may represent a Front Opening Unified Pod (FOUP), a Standard Mechanical Interface (SMIF) pod, a reticle container, a flat panel display transport device, among many others. For ease of description, the term "container" is used herein to refer to any type of container defined to house a number of semiconductor workpieces and equipped with a mechanically openable door.

The workpiece size in traditional semiconductor wafer manufacturing has been defined by a diameter of 300 mm. However, the next generation of workpiece size in semiconductor wafer manufacturing is expected to be defined by a larger diameter, e.g., 450 mm. The increase in workpiece size necessitates a larger container and correspondingly larger port door within the loadport architecture. The increased size of the workpiece also includes an increase in thickness of the workpiece, such that a total container payload weight with the larger workpieces is approximately two to three times greater than the total container payload weight with the previous smaller workpieces.

In one embodiment, a flexible workpiece retainer assembly is disposed on the interior side of the container door and is defined to retain the workpieces in their required position in the container when the container door is closed. The retaining effect provided by the flexible workpiece retainer assembly against the workpieces is achieved through the closing of the container door which in turn applies a holding force from the flexible workpiece retainer against each of the workpieces within the container. Closing of the container door is provided by the port door to which the container door is secured when removed from the container.

The port door is required to exert sufficient closing force against the container door to overcome a sum of forces directed against the closing force such that the container door is seated properly within the door opening of the container. The sum of forces directed against the closing force of the port door includes the total force required to engage the flexible workpiece retainer with each workpiece inside the container, and a force required to enable an air-tight seal about the perimeter of the container door. In one embodiment, the air-tight seal about the perimeter of the container door is provided by a flexible seal, such as silicone, rubber, or the like, against which the container door must be firmly pressed.

In the conventional loadport, such as that described with regard to FIG. 1, the port door 30 is connected to an arm 32, and movement of the port door 30 is provided by movement of the arm 32. Therefore, in the conventional embodiment, the closing force applied between the port door 30 and the container door 74 must be provided by movement of the arm 32 in the horizontal direction 33 toward the container 70. With the traditional semiconductor workpiece size of 300 mm diameter, a typical port door 30 closing force requirement was in the range of 2 to 10 pounds, and could be provided by the arm 32. However, for new larger semiconductor workpiece sizes, e.g., 450 mm diameter, a substantially larger port door 30 closing force is required and cannot be reliably provided by the arm 32.

More specifically, the increased payload weight and increased port door perimeter seal length, due to increased container size, together require a substantially larger port door closing force, which could be as much as 100 pounds or more. Also, the significant port door closing force increase is accompanied by a taller port door associated with a taller container due to the increased workpiece stack height within the container. The taller port door results in an increased moment arm length of the movable arm 32/port door 30 assembly. The combination of increased closing force requirements and increased moment arm length results in a substantially greater moment for the port door arm positioning mechanism, which can cause angular and axial deflection of the port door during the container closure process, which in turn can prevent proper placement and seating of the container door within the container. For example, the container door could be improperly seated within the container such that the flexible workpiece retainer assembly fails to properly engage all the workpieces and/or the container door fails to properly engage the seal disposed about the perimeter of the container door, and/or the latches on the port door fail to properly engage their receptacles in the container door.

The effects of uncontrolled deflection/positioning of the port door can result in potential damage to workpieces, and/or a failure to properly close and physically lock the container door in its correct position in the container shell. Failure to properly close the container door may result in workpiece damage or contamination as well as interruption of the processing tool's normal operation. Additionally, when opening the container, the port door needs to be pushed an equal distance toward the container door to ensure that the latch keys of the port door are properly positioned within their respective receptacles in the container door, prior to engaging the latch keys. Uncontrolled deflection/positioning of the port door can prevent proper positioning of the port door against the container door when opening the container.

The loadport embodiments disclosed herein provide a means for controlled horizontal port door motion with associated high port door closure force, without introducing adverse moment loads that could lead to unacceptable angular/positional deflection of the port door, with or without the container door secured thereto. To provide the required closing force without introducing adverse moment loads, the loadport embodiment disclosed herein implements an independent motion control mechanism that applies a horizontal displacement force to the port door assembly such that a line-of-action of the applied closing force vector is in direct opposition to resisting force vectors generated by the combination of the flexible workpiece retainer assembly and container door perimeter seal.

Figure 2A:
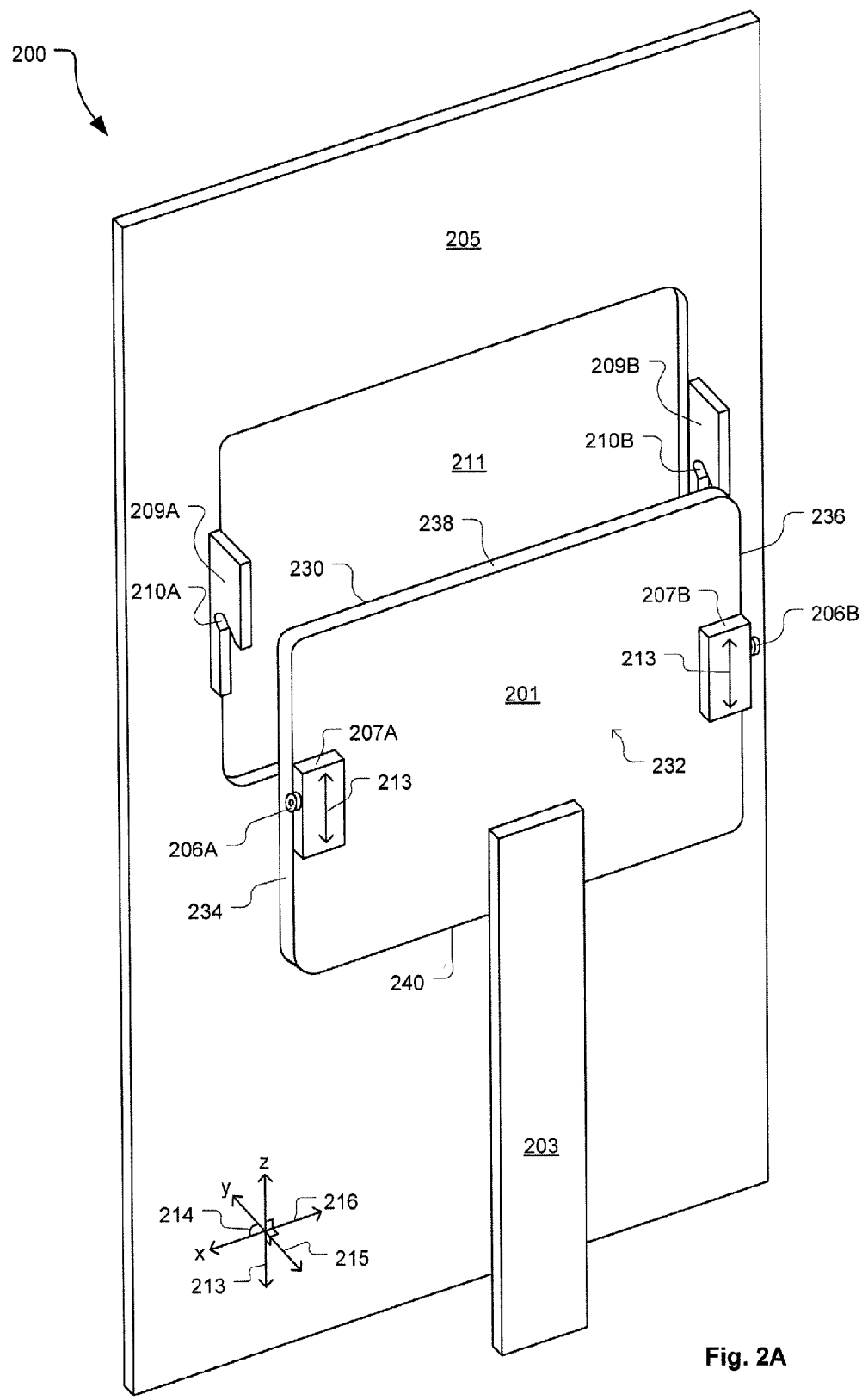
FIG. 2A shows a loadport that utilizes complementary movable and stationary port door closure mechanisms, with a movable roller connected to the port door and a fixed cam plate connected to the frame, in accordance with one embodiment of the present invention.

FIG. 2A shows a loadport 200, in accordance with one embodiment of the present invention. The loadport 200 includes a port door 201 having a front surface 230, a back surface 232, first and second vertical side surfaces 234/236, a top horizontal side surface 238, and a bottom horizontal side surface 240. The front surface 230 of the port door 201 is defined to interface with a container door of a container for holding semiconductor workpieces, when present. The loadport 200 also includes a frame 205 defined to have an opening 211 through which the port door 201 interfaces with the container door. In one embodiment, the frame 205 is defined as a BOLTS plate. A positioning device 203 is connected to the port door 201 to provide for controlled positioning and movement of the port door in the vertical direction, as indicated by arrows 213, and in the horizontal direction toward/away from the frame 205, as indicated by arrows 215. In one embodiment, the positioning device 203 is defined to move in a substantially linear manner in the horizontal direction 215 to provide for movement of the port door 201 in the horizontal direction 215 toward/away from the frame 205. However, in another embodiment, the positioning device 203 is defined to pivot toward/away from the frame 205 about a pivot point that is substantially distant from the port door 201 such that movement of the port door 201 toward/away from the frame 205 is in a substantially horizontal direction, albeit not in a strictly linear manner, but rather in a broad arcing manner. In the embodiment of FIG. 2A, the positioning device 203 is defined as an arm member. However, in other embodiments, the positioning device 203 can be defined as a different type of structural member capable of positioning and moving the port door 201 in the vertical and horizontal directions, as indicated by arrows 213 and 215, respectively.

The loadport 200 includes a movable closure mechanism 207A/B connected to the back surface 232 of the port door 201, so as to extend outwardly, i.e., horizontally, beyond each of the first and second vertical side surfaces 234/236 of the port door 201. The movable closure mechanism 207A/207B is defined to be movable in a controlled manner relative to both the port door 201 and the frame 205. In the embodiment of FIG. 2A, the movable closure mechanism 207A/B is defined to move in a substantially vertical direction as indicated by arrows 213. It should be understood that the port door 201 can be held by the positioning device 203 in a fixed vertical position as the movable closure mechanism 207A/B is moved relative to the port door 201.

The loadport 200 also includes a stationary closure mechanism 209A/B disposed on the frame 205 proximate to the opening 211 of the frame 205. The stationary closure mechanism 209A/B is defined and disposed to engage with the movable closure mechanism 207A/B that is connected to the port door 201. The positioning device 203 can be operated to position the port door 201 within the opening 211 of the frame 205 such that the movable closure mechanism 207A/B is ready to engage with the stationary closure mechanism 209A/B. Then, movement of the movable closure mechanism 207A/B to engage with the stationary closure mechanism 209A/B applies a closing force between the front surface 230 of the port door 201 and the container door. The closing force is directed in a substantially perpendicular direction between the front surface 230 of the port door 201 and the container door. It should be understood that the container door may already be secured to the front surface 230 of the port door 201, such as when replacing the container door to close the container, or the container door may be disposed within the container which is held proximate to the opening 211, such as when removing the container door from its container.

In one embodiment, such as that shown in FIG. 2A, the movable closure mechanism 207A/B includes as a pair of rollers 206A/B that each extend outwardly beyond a respective one of the first and second vertical side surfaces 234/236 of the port door 201 at a position behind the back surface 232 of the port door 201. In this embodiment, each of the pair of rollers 206A/B is defined to rotate about an axis of a central pin that is oriented in a substantially horizontal direction parallel to the frame 205. The central pin of each of the pair of rollers 206A/B is fixed to the movable closure mechanism 207A/B, such that movement of the movable closure mechanism 207A/B in a substantially vertical direction relative to the port door 201, as indicated by arrows 213, causes each of the pair of rollers 206A/B to also move in the substantially vertical direction relative to the port door 201. Also, the movable closure mechanism 207A/B is defined to cause movement of the pair of rollers 206A/B in a substantially simultaneous manner. It should be understood that in other embodiments the pair of rollers 206A/B can be replaced with a different form of guiding member, such as a pair of rigid guide pins or a pair of rotatable guide pins, among others.

Also in the loadport embodiment of FIG. 2A, the stationary closure mechanism 209A/B is defined as a pair of cam plates 209A/B respectively fixed proximate to the vertical sides of the opening 211 of the frame 205. Each of the pair of cam plates 209A/B includes a channel 210A/B formed to receive a respective one of the pair of rollers 206A/B, when the movable closure mechanism 209A/B is positioned and moved to engage with the stationary closure mechanism 209A/B. Each channel 210A/B is defined to translate movement of the roller 206A/B therein into a movement of the port door 201 perpendicularly toward the container door so as to apply the closing force.

Figure 2B:
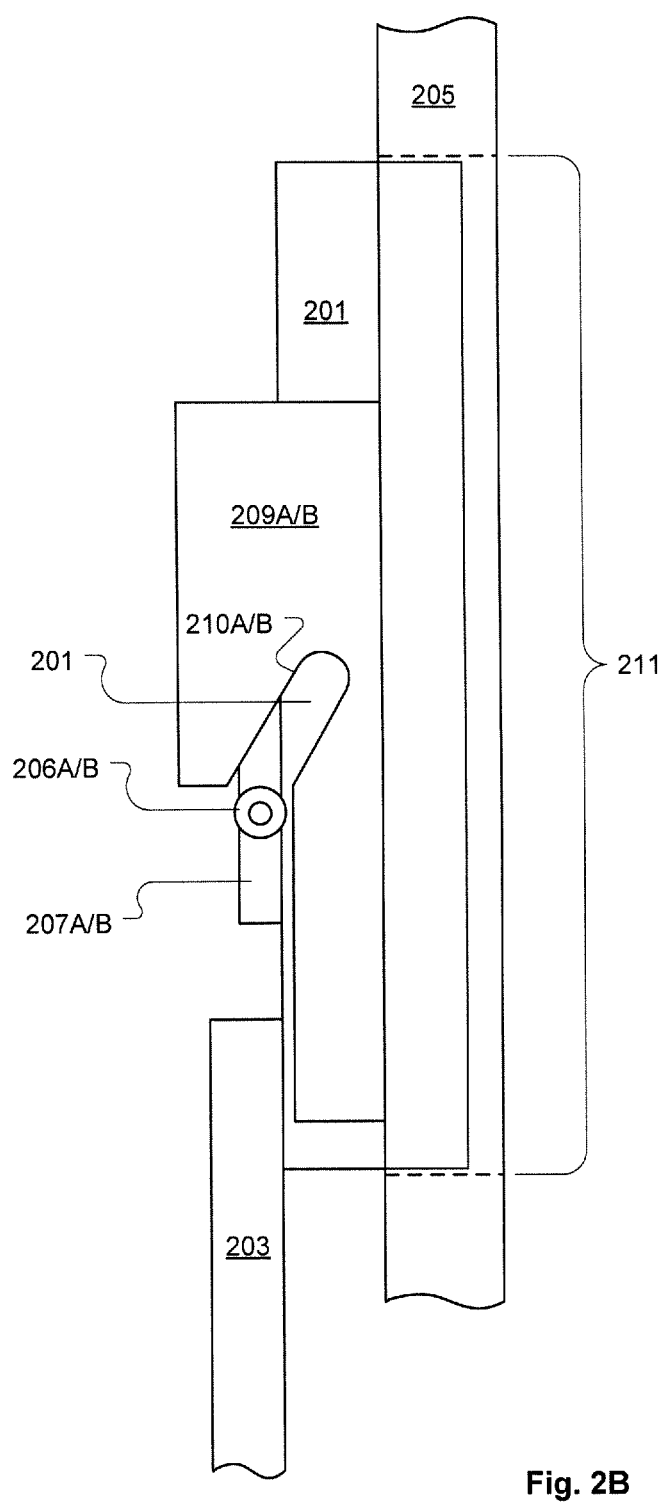
FIG. 2B shows a side view of the roller of the movable closure mechanism relative to the stationary cam plate, with the port door in a closure-ready position, in accordance with one embodiment of the present invention.

FIG. 2B shows a side view of the roller 206A/B of the movable closure mechanism 207A/B relative to the stationary cam plate 209A/B, with the port door 201 in a closure-ready position such that the roller 206A/B is ready to engage the cam plate 209A/B, in accordance with one embodiment of the present invention. The port door 201 is moved to the closure-ready position by the positioning device 203. During the closure process, the positioning device 203 is operated to maintain a vertical position of the port door 201, while allowing for horizontal movement of the port door 201 in a direction perpendicular to the frame 205. In one embodiment, a horizontal drive associated with movement of the positioning device 203 is disengaged to allow for free horizontal movement of the port door 201 in the direction perpendicular to the frame 205 during the closure process. In another embodiment, the horizontal drive associated with movement of the positioning device 203 remains engaged but is operated to follow/support the horizontal movement of the port door 201 in the direction perpendicular to the frame 205 during the closure process.

Figure 2C:
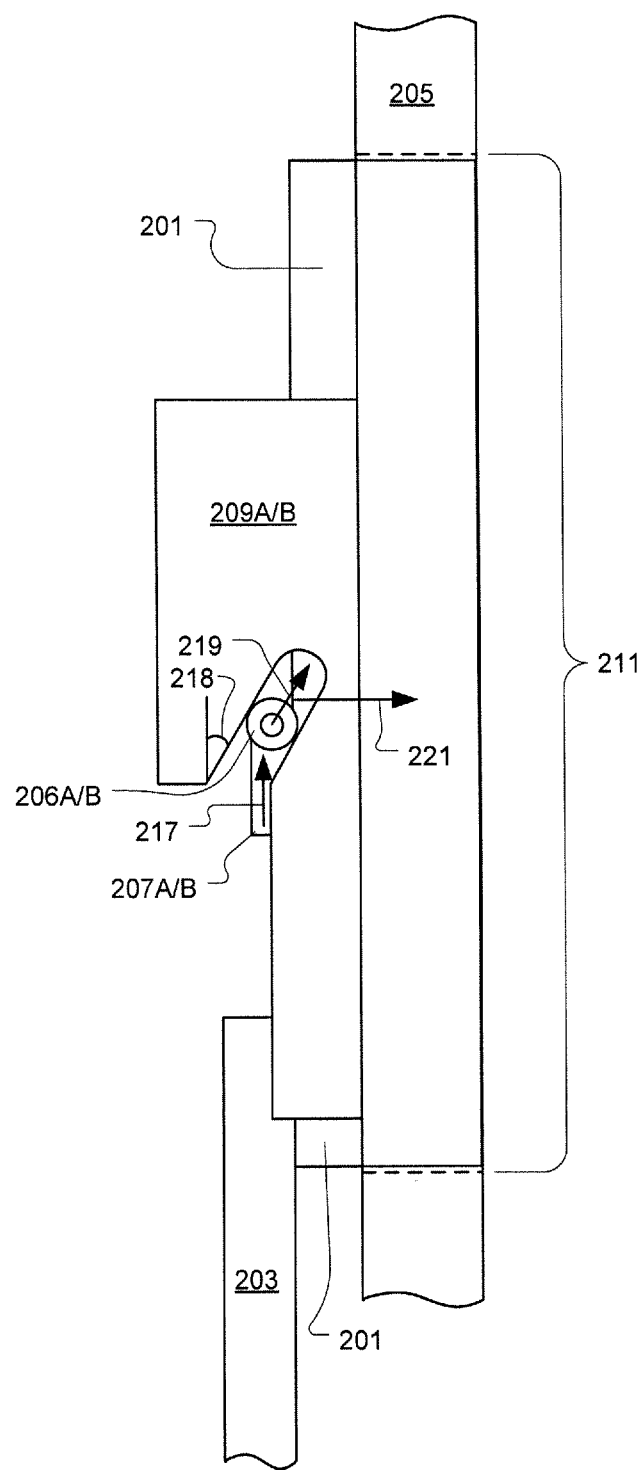
FIG. 2C shows a side view of the roller moving along the channel of the stationary cam plate, in accordance with one embodiment of the present invention.

FIG. 2C shows a side view of the roller 206A/B moving along the channel 210A/B of the stationary cam plate 209A/B, in accordance with one embodiment of the present invention. As the movable closure mechanism 207A/B is moved in a vertical direction 217, the roller 206A/B contacts and follows the channel 210A/B of the cam plate 209A/B in a direction 219. Because the vertical position of the port door 201 is held fixed by the positioning device 203, and because the channel 210A/B is angle toward the frame 205, movement of the roller 206A/B along the channel 210A/B causes a corresponding movement of the port door 201 in a substantially horizontal direction 221 perpendicular to the frame 205, thereby moving the port door 201 through the opening 211 to perform the container closure process.

It should be understood that a closure force applied in the horizontal direction 221 is dependent upon a vertical force applied to move the movable closure mechanism 207A/B in the vertical direction 217 and an angle 218 of the channel 210A/B as defined relative to the vertical direction 217. In one embodiment, the closure force applied in the horizontal direction 221 is proportion to a product of the vertical force applied to move the movable closure mechanism 207A/B in the vertical direction 217 and the tangent of the channel 210A/B angle 218. Also, because the port door 201 is defined as a rigid structure, it is possible to apply a significant vertical force to move the movable closure mechanism 207A/B in the vertical direction 217. Therefore, it is possible to obtain a correspondingly significant port door 201 closure force in the horizontal direction 221. In one example embodiment, a port door 201 closure force of up to 200 pounds can be generated by the complementary movable and stationary closure mechanisms disclosed herein.

Figure 2D:
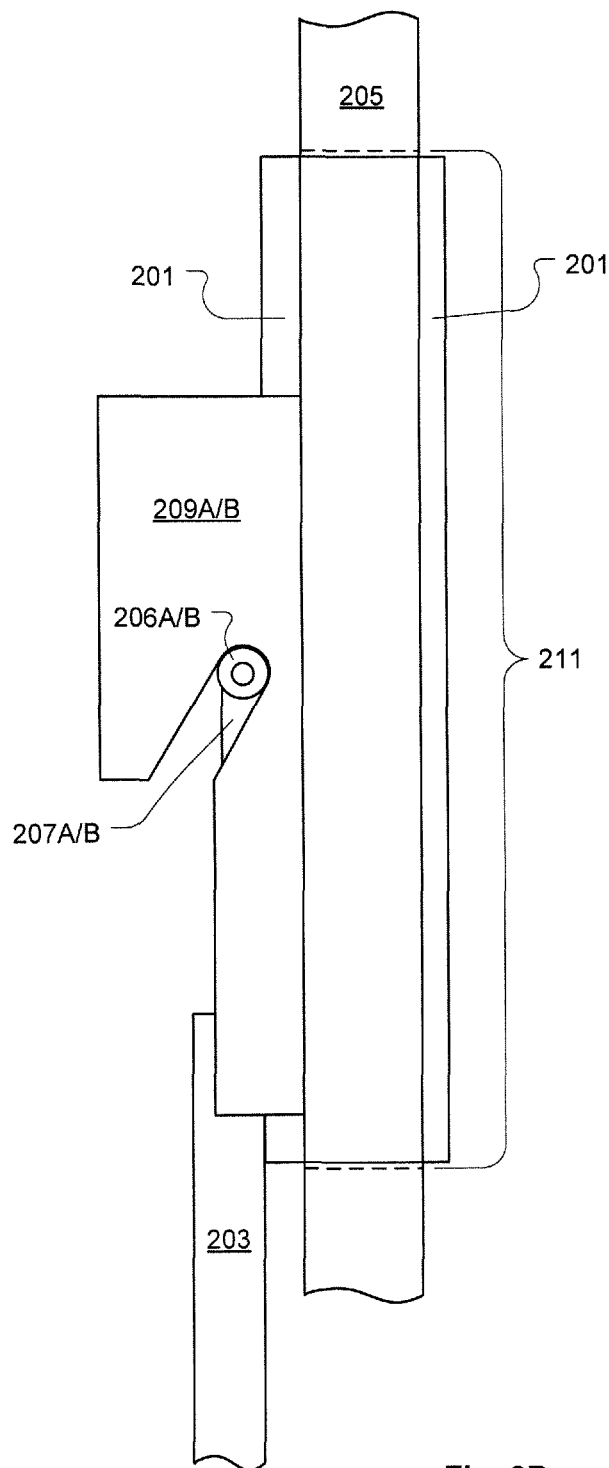
FIG. 2D shows a side view of the roller within the channel of the stationary cam plate at a fully closed position of the port door, in accordance with one embodiment of the present invention.

FIG. 2D shows a side view of the roller 206A/B position within the channel 210A/B of the stationary cam plate 209A/B at a fully closed position of the port door 201, in accordance with one embodiment of the present invention. In one embodiment, the channel 210A/B is defined longer than necessary for full closure of the port door 201, with closure of the port door 201 being stopped by a control means. In one embodiment, the control means for stopping closure of the port door 201 is provided through control of a drive source connected to move the movable closure mechanism 207A/B. In various example embodiments, the drive source may be an electric motor, a servo motor, a stepper motor, or essentially any other type of motor that can be mechanically connected to provide movement of the movable closure mechanism 207A/B, and that is compatible with the environmental requirements associated with the loadport equipment. In these various example embodiments, the drive source motor can be operated to provide the control means by which closure of the port door 201 is stopped.

Additionally, in various embodiments, different types of triggering mechanisms can be implemented to direct the drive source, e.g., motor, to stop closure of the port door 201. For example, one or more of an optical sensor, a mechanical switch, an electrical switch, an electrical sensor, or essentially any other type of position detection device can be utilized to provide port door 201 position feedback signals that can in turn be used to control the drive source to provide appropriate movement stoppage of the movable closure mechanism 207A/B and port door 201. Also, in an embodiment where an encoder-controlled motor is used as the drive source, an encoder setting can be provided to control movement stoppage of the motor and corresponding movement stoppage of the port door 201.

In another alternative embodiment, a number of hard stops can be disposed between the port door 201 and frame 205 to stop movement of the port door 201. In one example of this embodiment, the hard stops are mounted on the back of the frame 205, and corresponding contact elements are mounted on the port door 201. In this embodiment, closure of the port door 201, by way of the complementary movable and stationary closure mechanisms, continues until the contact elements on the port door 201 contact the hard stops on the frame 205, thereby achieving precise and rigid positioning of the port door 201 front surface 230 plane with respect to the frontal plane of the frame 205. Also, the contact elements and/or the hard stops can be adjustable in thickness and position about the port door 201 perimeter to enable orientation adjustment of the port door 201 front surface 230 plane. Use of hard stops as described above can be particularly beneficial when paired with certain types of pressure-controlled drive sources, such as a pneumatic cylinder drive source connected to provide movement of the movable closure mechanism 207A/B, by way of example. Additionally, in another alternative embodiment, a length of the channel 210A/B can be defined to provide a full-closure stop for the port door 201. Or, alternatively, a set screw can be disposed in a terminal end of the channel 210A/B to provide an adjustable full-closure stop for the port door 201.

Figure 2E:
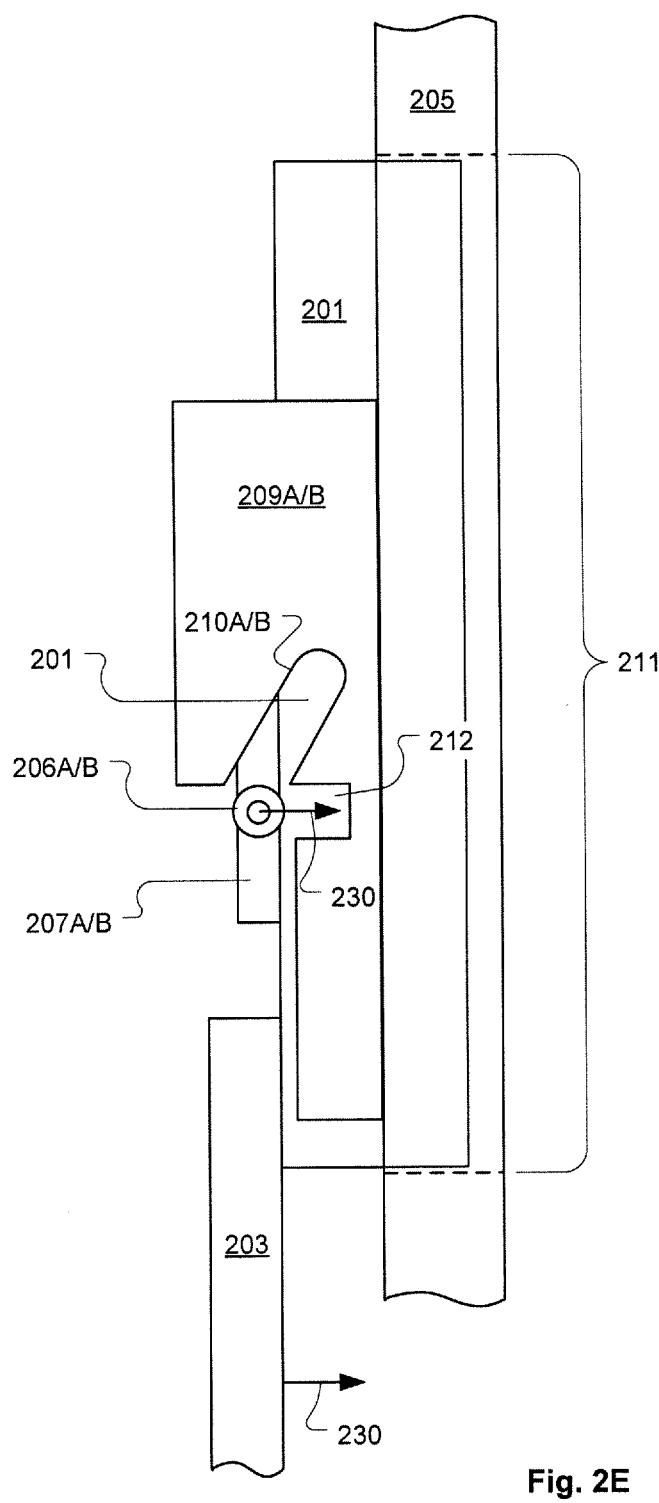
FIG. 2E shows a side view of an alternate configuration of the stationary cam plate, with the port door in a closure-ready position, in accordance with one embodiment of the present invention.

FIG. 2E shows a side view of an alternate configuration of the stationary cam plate 209A/B, with the port door 201 in a closure-ready position, in accordance with one embodiment of the present invention. The roller 206A/B is ready to engage the channel 210A/B of the stationary cam plate 209A/B by vertical movement of the movable closure mechanism 207A/B. However, in this embodiment, the stationary cam plate 209A/B also includes a horizontal clearance channel 212 to provide for movement of the roller 206A/B in the horizontal direction 230. In this embodiment, two options are available for closure of the port door 201 from the closure-ready position. One option is to move the movable closure mechanism 207A/B in the vertical direction to move the roller 206A/B through the channel 210A/B, to apply high-force closure as described above with regard to FIGS. 2B-2D. Another option is to not move the movable closure mechanism 207A/B, but rather, move the positioning arm 203 in the horizontal direction 230 to cause movement of the port door 201 in the horizontal direction 230, thereby causing the roller 206A/B to move through the clearance channel 212.

Figure 3A:
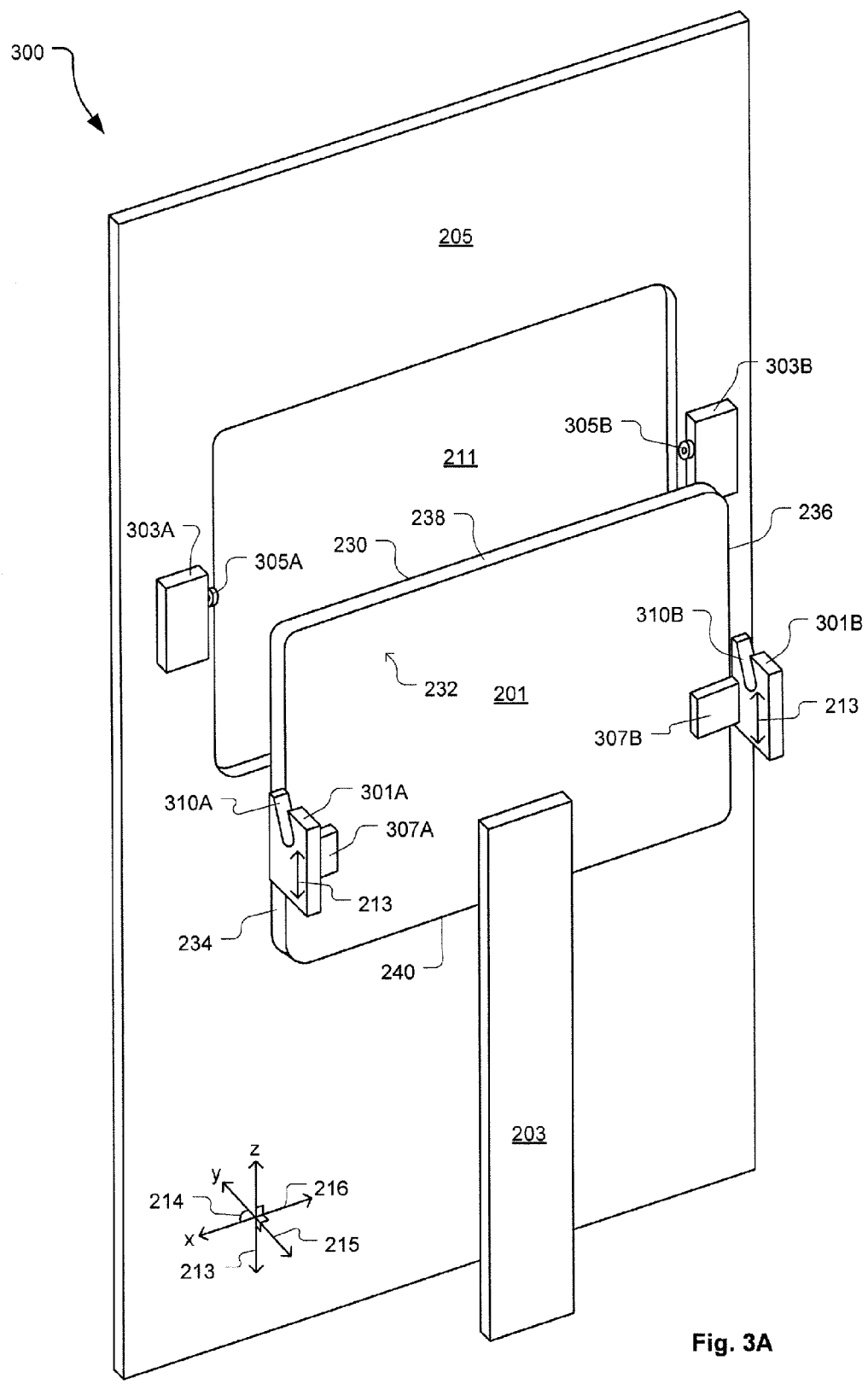
FIG. 3A shows a loadport that utilizes complementary movable and stationary port door closure mechanisms, with a movable cam plate connected to the port door and a fixed roller connected to the frame, in accordance with one embodiment of the present invention.

FIG. 3A shows a loadport 300, in accordance with another embodiment of the present invention. The loadport 300 of FIG. 3A is essentially like the loadport 200 of FIG. 2A, with the rollers 206A/B and cam plates 209A/B effectively swapped for each other. The loadport 300 includes the port door 201, the positioning device 203, and the frame 205 as previously described with regard to FIG. 2A. In this embodiment, the loadport 300 includes a movable closure mechanism 307A/B connected to the back surface 232 of the port door 201, so as to extend outwardly, i.e., horizontally, beyond each of the first and second vertical side surfaces 234/236 of the port door 201. The movable closure mechanism 307A/B is defined to be movable in a controlled vertical manner relative to both the port door 201 and the frame 205, as indicated by arrows 213. The port door 201 can be held by the positioning device 203 in a fixed vertical position as the movable closure mechanism 307A/B is moved relative to the port door 201. Each movable closure mechanism includes a cam plate 301A/B.

The loadport 300 also includes a stationary closure mechanism 303A/B disposed on the frame 205 proximate to the opening 211 of the frame 205. The stationary closure mechanism 303A/B includes rollers 305A/B defined to engage with the movable closure mechanism 307A/B that is connected to the port door 201. Each of the rollers 305A/B is defined to rotate about a respective central pin fixed to the stationary closure mechanism 303A/B. It should be understood that in other embodiments the rollers 305A/B can be replaced with a different form of guiding member, such as rigid guide pins or rotatable guide pins, among others. The positioning device 203 can be operated to position the port door 201 within the opening 211 of the frame 205 such that each of the cam plates 301A/B of the movable closure mechanism 307A/B is ready to engage with the respective rollers 305A/B of the stationary closure mechanism 303A/B. Movement of the movable closure mechanism 307A/B to engage with the stationary closure mechanism 303A/B applies a closing force between the front surface 230 of the port door 201 and the container door. The closing force is directed in a substantially perpendicular direction between the front surface 230 of the port door 201 and the container door.

Figure 3B:
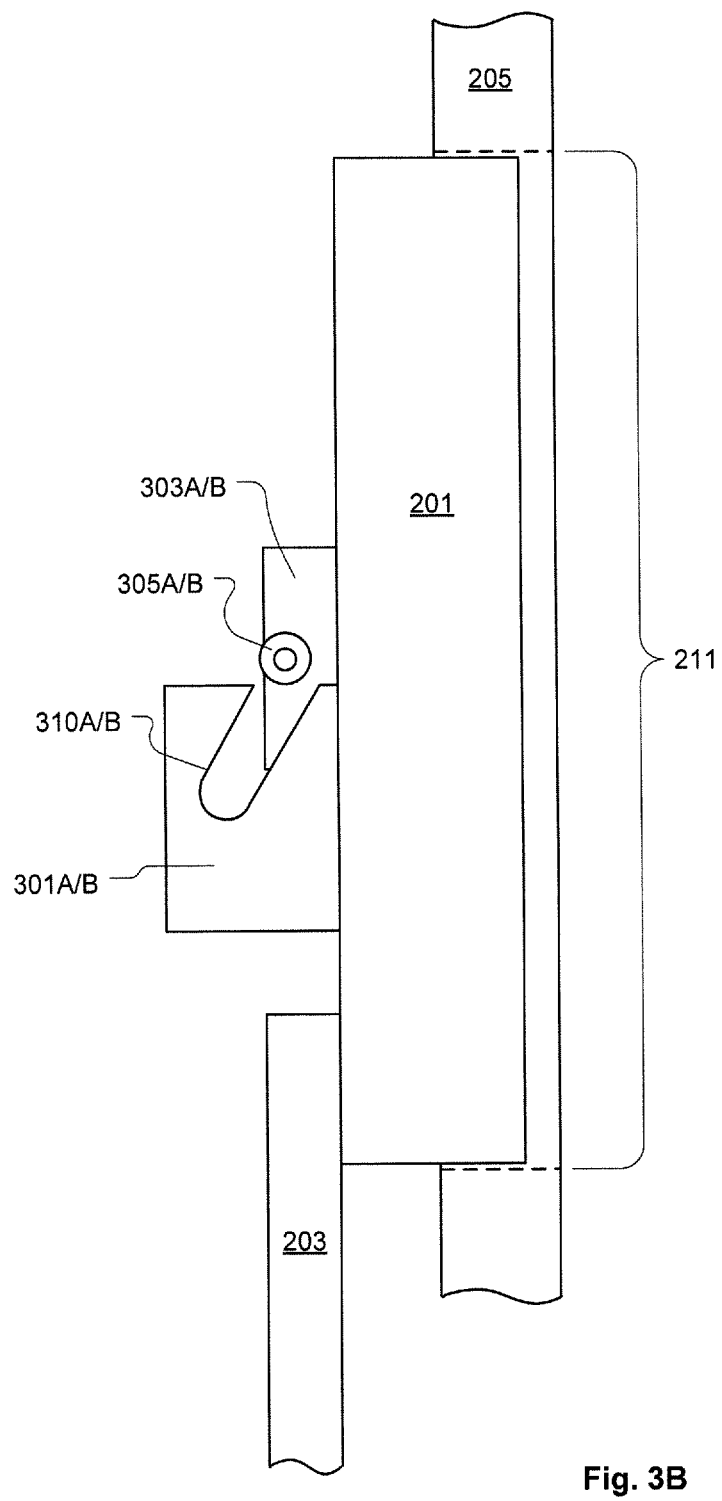
FIG. 3B shows a side view of the cam plate of the movable closure mechanism relative to the stationary roller, with the port door in a closure-ready position, in accordance with one embodiment of the present invention.

FIG. 3B shows a side view of the cam plate 301A/B of the movable closure mechanism 307A/B relative to the stationary rollers 305A/B, with the port door 201 in a closure-ready position such that the cam plate 301A/B is ready to engage the roller 305A/B, in accordance with one embodiment of the present invention. Again, during the closure process, the positioning device 203 is operated to maintain a vertical position of the port door 201, while allowing for horizontal movement of the port door 201 in a direction perpendicular to the frame 205.

Figure 3C:
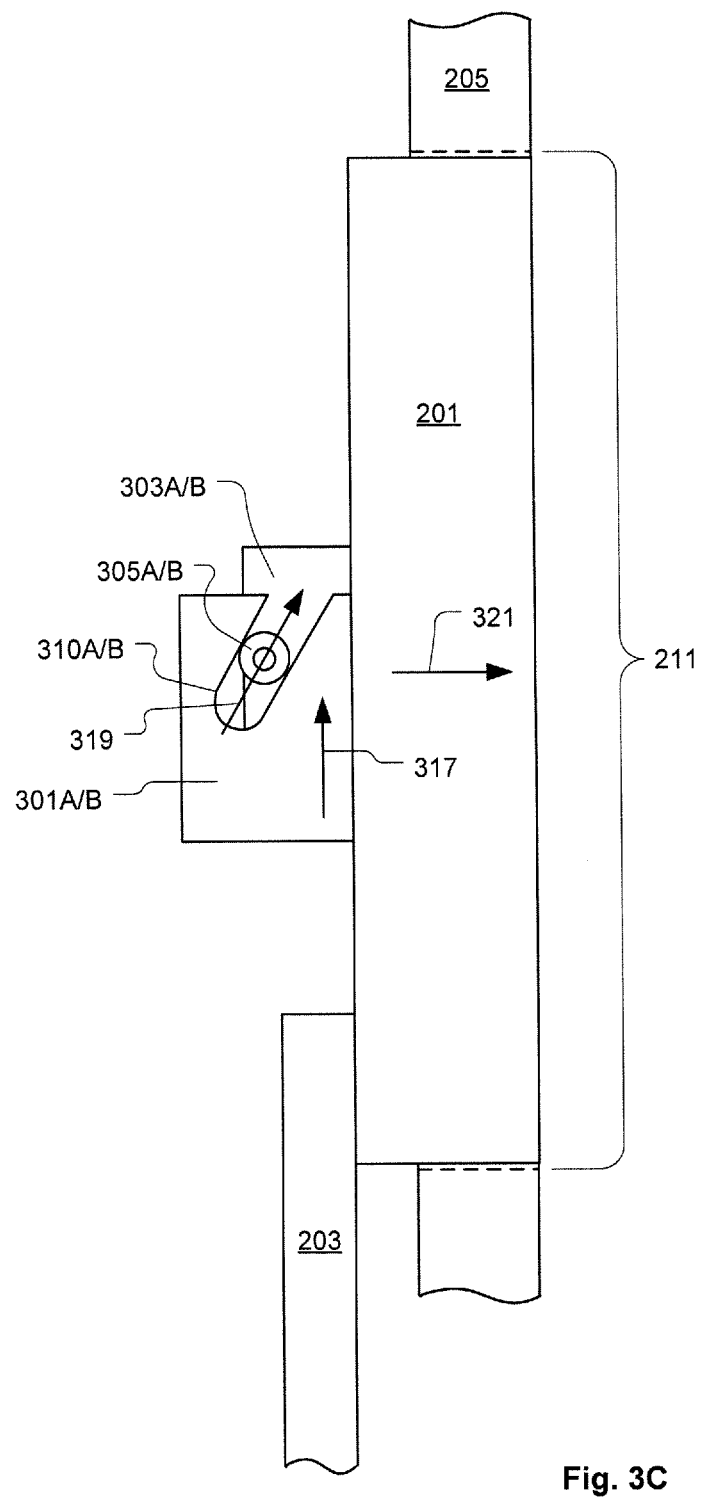
FIG. 3C shows a side view of the channel of the cam plate moving along the roller, in accordance with one embodiment of the present invention.

FIG. 3C shows a side view of the channel 310A/B of the cam plate 301A/B moving along the roller 305A/B, in accordance with one embodiment of the present invention. As the movable closure mechanism 307A/B is moved in the vertical direction 317, the cam plate 301A/B channel 310A/B contacts and follows the fixed roller 305A/B in the direction 319. Because the vertical position of the port door 201 is held fixed by the positioning device 203, and because the channel 310A/B is angled toward the frame 205, movement of the channel 310A/B along the roller 305A/B causes a corresponding movement of the port door 201 in a substantially horizontal direction 321 perpendicular to the frame 205, thereby moving the port door 201 through the opening 211 to perform the container closure process.

Figure 3D:
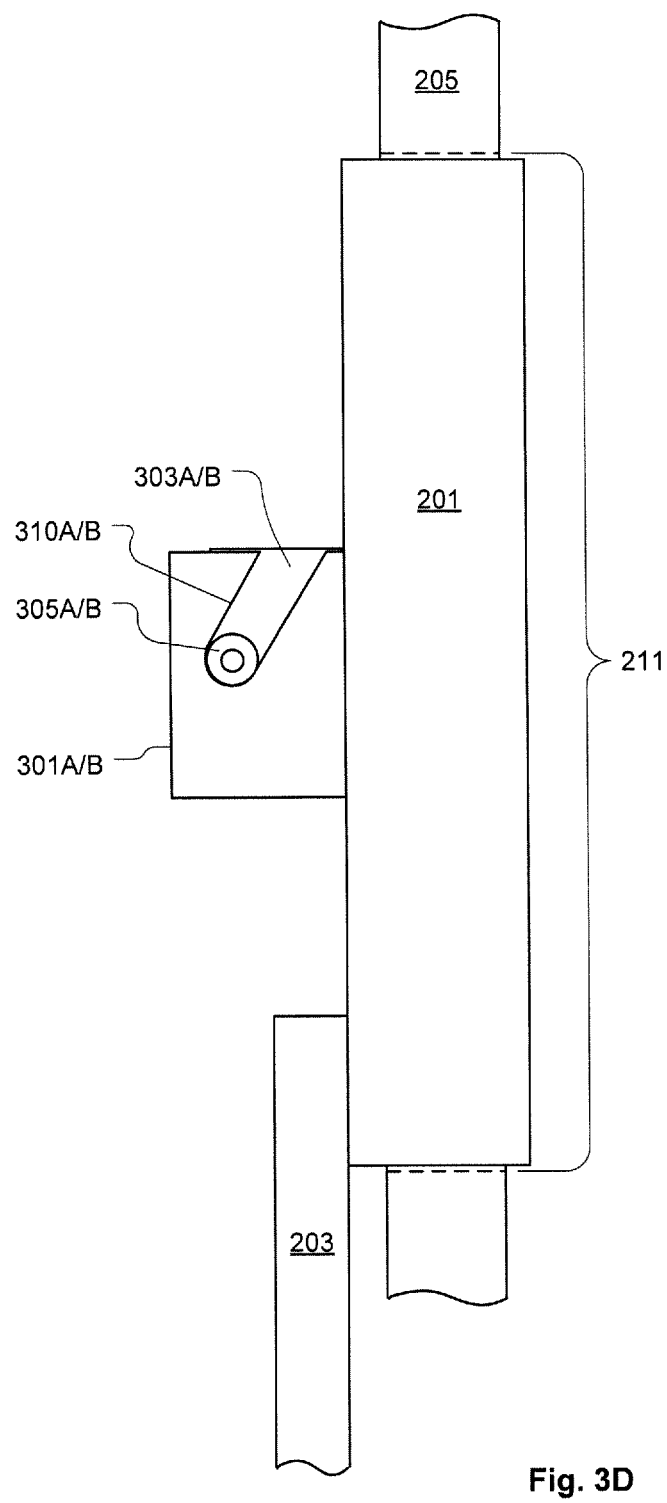
FIG. 3D shows a side view of the movable cam plate and stationary roller at a fully closed position of the port door, in accordance with one embodiment of the present invention.

FIG. 3D shows a side view of the movable cam plate 301A/B and stationary roller 305A/B at a fully closed position of the port door 201, in accordance with one embodiment of the present invention. It should be understood that the various embodiments discussed above with regard to FIG. 2D concerning movement stoppage of the port door 201 are equally applicable to controlling movement stoppage of the port door 201 in embodiment of FIG. 3D.

Figure 4:
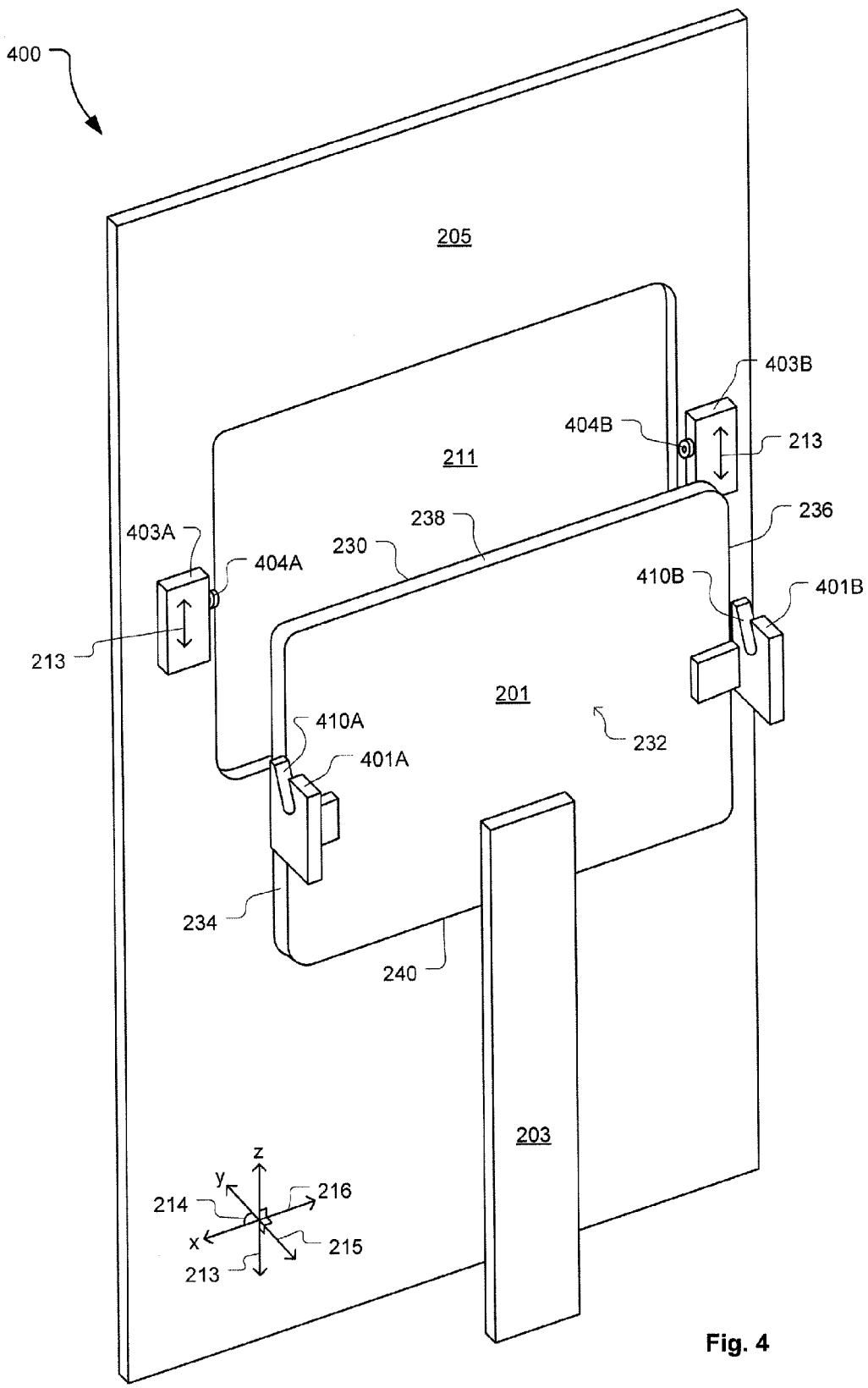
FIG. 4 shows a loadport that utilizes complementary movable and stationary port door closure mechanisms, with a movable roller connected to the frame and a fixed cam plate connected to the port door, in accordance with one embodiment of the present invention.

FIG. 4 shows a loadport 400, in accordance with another embodiment of the present invention. The loadport 400 includes the port door 201, the positioning device 203, and the frame 205 as previously described with regard to FIG. 2A. In this embodiment, the loadport 400 includes a stationary closure mechanism 401A/B connected to the back surface 232 of the port door 201, so as to extend outwardly, i.e., horizontally, beyond each of the first and second vertical side surfaces 234/236 of the port door 201. The example embodiment shown in FIG. 4 utilizes a pair of fixed cam plates 401A/13 as the stationary closure mechanism 401A/B, with each of the pair of fixed cam plates 401A/B defined to have a respective angled channel 410A/B.

The loadport 400 also includes a movable closure mechanism 403A/B disposed on the frame 205 proximate to the opening 211 of the frame 205. The movable closure mechanism 403A/B is defined to engage with the stationary closure mechanism 401A/B. In the example embodiment of FIG. 4, the movable closure mechanism 403A/B includes respective rollers 404A/B. It should be understood that in other embodiments the rollers 404A/B can be replaced with a different form of guiding member, such as rigid guide pins or rotatable guide pins, among others. The movable closure mechanism 403A/B is defined to be vertically moved in a controlled manner relative to both the frame 205 and the port door 201, as indicated by arrows 213. In a manner similar to that described with regard to FIGS. 2B-2D, movement of the movable closure mechanism 403A/B to engage the rollers 404A/B with the channels 410A/B of the cam plates 401A/B of the stationary closure mechanism 401A/B applies a closing force between the front surface 230 of the port door 201 and the container door.

Figure 5:
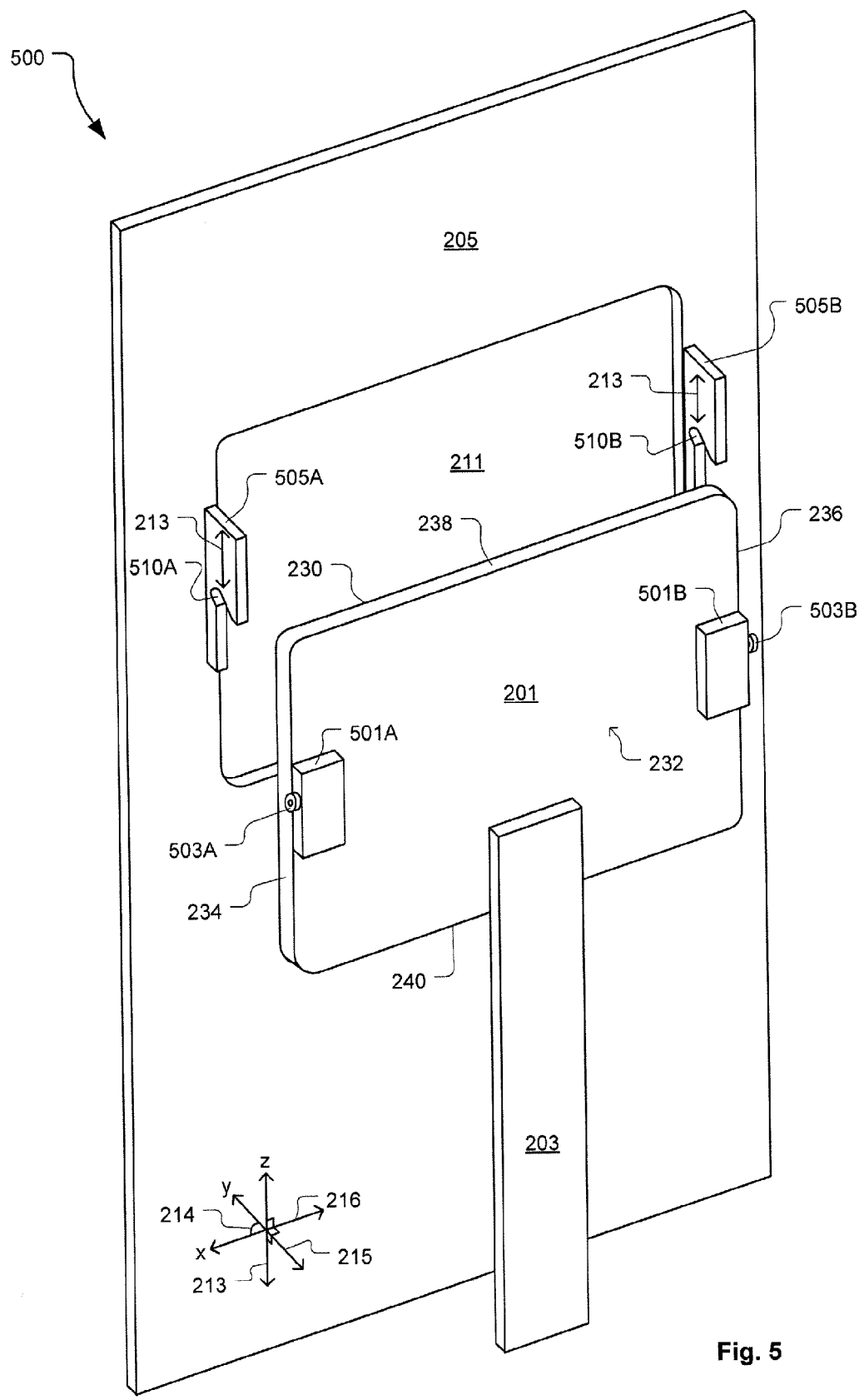
FIG. 5 shows a loadport that utilizes complementary movable and stationary port door closure mechanisms, with a movable cam plate connected to the frame and a fixed roller connected to the port door, in accordance with one embodiment of the present invention.

FIG. 5 shows a loadport 500, in accordance with another embodiment of the present invention. The loadport 500 includes the port door 201, the positioning device 203, and the frame 205 as previously described with regard to FIG. 2A. In this embodiment, the loadport 500 includes a stationary closure mechanism 501A/B connected to the back surface 232 of the port door 201, so as to extend outwardly, i.e., horizontally, beyond each of the first and second vertical side surfaces 234/236 of the port door 201. The example embodiment shown in FIG. 5 includes a pair of fixed rollers 503A/B connected to the stationary closure mechanism 501A/B. It should be understood that in other embodiments the rollers 503A/B can be replaced with a different form of guiding member, such as rigid guide pins or rotatable guide pins, among others.

The loadport 500 also includes a movable closure mechanism 505A/B disposed on the frame 205 proximate to the opening 211 of the frame 205. The movable closure mechanism 505A/B is defined to engage with the stationary closure mechanism 501A/B. In the example embodiment of FIG. 5, the movable closure mechanism 505A/B is defined as a pair of movable cam plates 505A/B, with each movable cam plate 505A/B having a respective angled channel 510A/B. The movable closure mechanism 505A/B is defined to be vertically moved in a controlled manner relative to both the frame 205 and the port door 201, as indicated by arrows 213. In a manner similar to that described with regard to FIGS. 3B-3D, movement of the cam plates 505A/B on the frame 205 to engage their respective angled channels 510A/B with the rollers 503A/B connected to the stationary closure mechanism 501A/B applies a closing force between the front surface 230 of the port door 201 and the container door.

Figure 6:
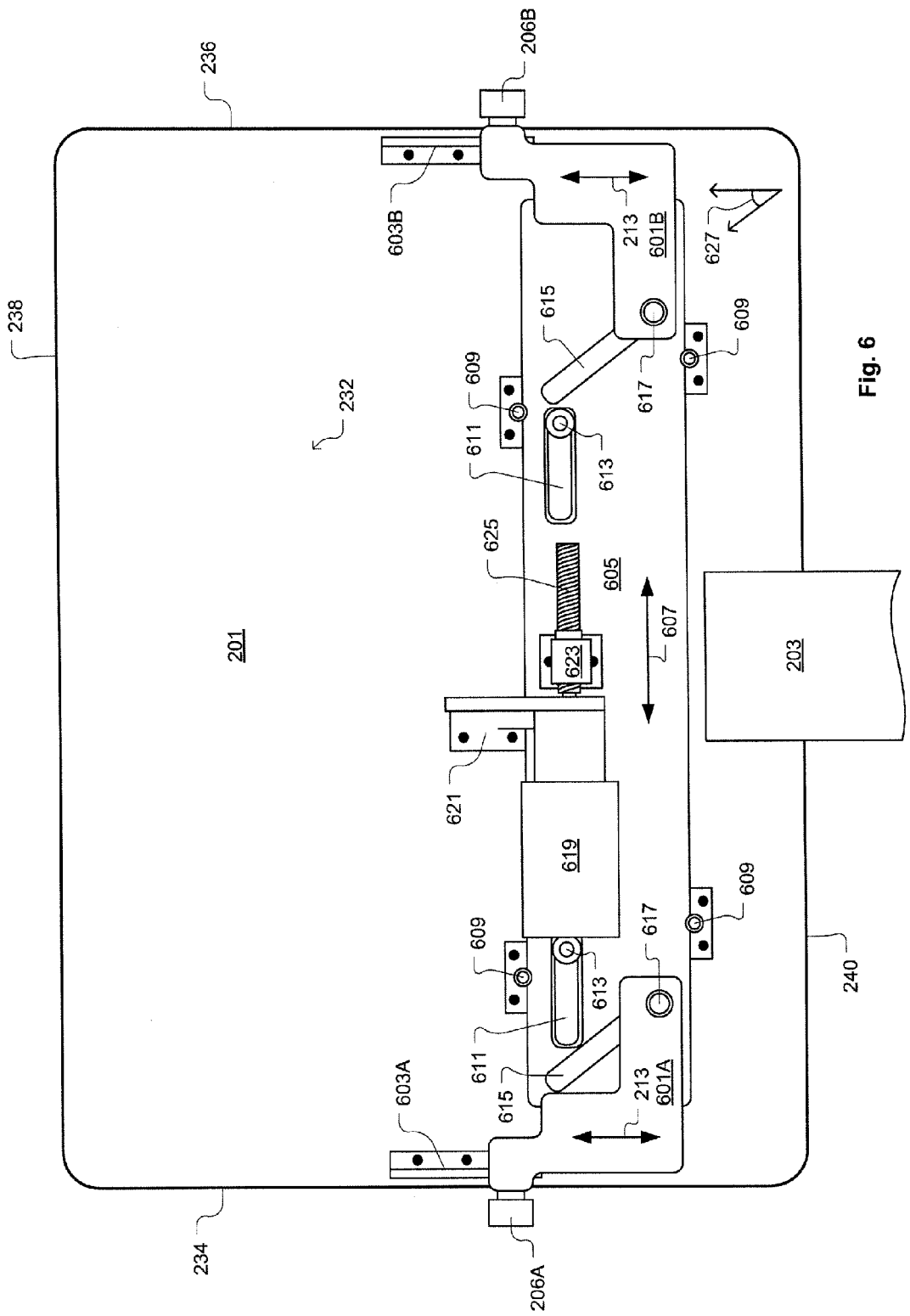
FIG. 6 shows an example implementation of the port door in the loadport embodiment of FIG. 2A, in accordance with one embodiment of the present invention.

FIG. 6 shows an example implementation of the port door 201 in the loadport embodiment of FIG. 2A, in accordance with one embodiment of the present invention. The movable closure mechanism 207A/B is defined by a pair of drive plates 601A/B with the pair of rollers 206A/B respectively connected thereto. Again, it should be understood that in other embodiments the pair of rollers 206A/B can be replaced with a different form of guiding member, such as a pair of rigid guide pins or a pair of rotatable guide pins, among others. Each of the rollers 206A/B extends outwardly beyond a respective one of the vertical side surfaces 234/236 of the port door 201 at a position behind the back surface 232 of the port door 201. In one embodiment, a pair of drive tracks 603A/B are connected to the back surface 232 of the port door 201. Each of the drive plates 601A/B is connected to a respective one of the drive tracks 603A/B and is defined to travel along the drive track 603A/B to which it is connected. Each of the drive tracks 603A/B is oriented to direct movement of the drive plate 601A/B connected thereto in the substantially vertical direction 213. In one embodiment, the drive tracks 603A/B are defined as metal slides on bearing rails. However, in other embodiments, the drive tracks 603A/B can be defined in other ways so long as the drive tracks 603A/B provide for linear motion of the drive plates 601A/B connected thereto and are compatible with the processing environment specifications.

In another embodiment, the drive tracks 603A/B can be replaced by a pair of vertically oriented guide channels formed within the port door 201, or within a member connected to the port door 201. In this embodiment, each of the drive plates 601A/B can be formed to have a sliding member that fits within its corresponding guide channel in a retained manner, such that the sliding member can move along the guide channel.

The port door 201 assembly also includes a drive source defined to control movement of the pair of drive plates 601A/B along their respective drive tracks 603A/B. Also, a mechanical linkage is defined to translate work of the drive source into substantially simultaneous movement of the pair of drive plates 601A/B.

In the example embodiment of FIG. 6, the mechanical linkage is defined as a motion transfer plate 605 defined to move in a substantially horizontal direction 607 relative to the port door 201. In one embodiment, a number of guide rollers 609 are disposed to engage the horizontally oriented edges of the motion transfer plate 605. In this manner, guide rollers 609 direct movement of the motion transfer plate 605 in the substantially horizontal direction 607 relative to the port door 201. Additionally, a number of slots 611 (two slots 611 in this example embodiment) are formed within the motion transfer plate 605. Guide pins 613 corresponding to the slots 611 are fixed to the back surface 232 of the port door 201. The guide pins 613 are defined to extend through and travel within the slots 611. Because the slots 611 are formed to extend in the substantially horizontal direction 607, interfacing of the slots 611 with the fixed guide pins 613 assists in guiding the motion transfer plate 605 in the substantially horizontal direction 607.

The motion transfer plate 605 is defined to engage each of the pair of drive plates 601A/B, such that substantially horizontal movement of the motion transfer plate 605 in the direction 607 causes substantially equal and simultaneous vertical movement of each of the pair of drive plates 601A in the vertical direction 213, along with corresponding vertical movement of the pair of rollers 206A/B. In the embodiment of FIG. 6, the motion transfer plate 605 includes a pair of angled slots 615. Also, each of the pair of drive plates 601A/B includes a respective pin 617 rigidly connected thereto and formed to travel within a respective one of the pair of angled slots 615. Each of the angled slots 615 is formed to extend along a common angle 627 that is offset from the vertical direction 213, as drawn within a reference plane parallel to the port door 201. It should be appreciated that as the motion transfer plate 605 is moved in the horizontal direction 607, the pin 617 of each drive plate 601A/B is engaged by its respective slot 615 of the motion transfer plate 605. In this manner, the common angle 627 of the slots 615 causes horizontal movement of the motion transfer plate 605 to be translate into vertical movement of the drive plates 601A/B along their respective drive tracks 603A/B.

In the example embodiment of FIG. 6, the drive source is a motor 619 having a lead screw 625 connected thereto for rotation by the motor 619. The motor 619 is rigidly connected to the back surface 232 of the port door 201 at a fixed position. For example, a bracket assembly 621 can be used to connect the motor 619 to the port door 201. It should be understood that the motor 619 is electrically connected to be powered and controlled. A nut 623 threaded in a complementary manner with the lead screw 625 is rigidly connected to the motion transfer plate 605 to receive the lead screw 625. The lead screw 625 and the nut 623 are oriented in the substantially horizontal direction 607 relative to the port door 201 such that rotation of the lead screw 625 within the nut 623 moves the nut 623 and motion transfer plate 605 connected thereto in the substantially horizontal direction 607. Thus, operation of the motor 619 to rotate the lead screw 625 provides for horizontal movement of the motion transfer plate 605 and corresponding vertical movement of the drive plates 601A/B.

In various example embodiments, the motor 619 may be an electric motor, a servo motor, a stepper motor, or essentially any other type of motor that can be mechanically connected to provide controlled movement of the drive plates 601A/B, and that is compatible with the environmental requirements associated with the loadport equipment. In these various example embodiments, the motor 619 can be operated to provide the control means by which closure of the port door 201 is both initiated and stopped. Additionally, in various embodiments, different types of triggering mechanisms can be implemented to direct the motor 619 to stop closure of the port door 201. For example, one or more of an optical sensor, a mechanical switch, an electrical switch, an electrical sensor, or essentially any other type of position detection device can be utilized to provide port door 201 position feedback signals that can in turn be used to control the motor 619 to provide appropriate movement stoppage of the drive plates 601A/B and port door 201. Also, in an embodiment where the motor 619 is an encoder-controlled motor, an encoder setting can be provided to control movement stoppage of the motor 619 and corresponding movement stoppage of the drive plates 601A/B and port door 201.

It should be understood that the drive source is not limited to the motor 619/lead screw 625/nut 623 combination. In other embodiments, different drive sources and configurations can be applied to impart controlled horizontal movement to the motion transfer plate 605. For example, in one embodiment, the drive source is a pneumatic cylinder having a drive rod connected to itself and to the motion transfer plate 605. More specifically, the pneumatic cylinder is connected to the back surface of the port door 201 at a fixed position, and the drive rod is connected to the motion transfer plate 605, such that movement of the drive rod causes movement of the motion transfer plate 605 in the substantially horizontal direction. In yet another embodiment, a rack-and-pinion gear system and associated drive motor can be defined to translate circular motion of a pinion gear into linear motion of a rack gear that is connected to the motion transfer plate 605, vice-versa. Also, in alternative embodiments of the loadports 200, 300, 400, 500 disclosed herein, the movable closure mechanisms can be moved independently using separate respective drive sources that are commonly encoded to operate in a tandem manner to provide for substantially simultaneous and equal movement of the movable closure mechanisms.

Regardless of the specific embodiment, the drive source and corresponding mechanical linkage implemented to move the drive plates 601A/B in the vertical direction 213 are defined to optimally limit required maintenance and to reduce particulate creation, which could contribute to semiconductor workpiece contamination. Also, port door 201 position monitoring devices and drive source force monitoring devices can be utilized to provide safeguards for protecting semiconductor workpieces and/or other system elements. Additionally, it should be appreciated that the example loadport implementation of FIG. 6 can also be utilized with the loadport embodiment depicted in FIGS. 3A-3D. In this case, cam plates 301A/B replace the rollers 601A/B. The cam plates 301A/B can be defined as part of the drive plates 601A/B, or can be defined separately and connected to the drive plates 601A/B.

In one embodiment, the complementary stationary and movable closure mechanisms described with regard to the loadports 200, 300, 400, 500, are disposed such that a line of action of the closure force vector nominally passes through a centerline of the port door 201, which is normally in direct opposition to a line of action of the sum of forces directed against the closing force, e.g., the sum of the total force required to engage the flexible workpiece retainer with each workpiece inside the container and a force required to enable an air-tight seal about the perimeter of the container door. In another embodiment, the complementary stationary and movable closure mechanisms described with regard to the loadports 200, 300, 400, 500, are disposed such that a line of action of the closure force vector is offset from the centerline of the port door 201, but is positioned to overcome the sum of opposing forces directed against the closing force.

Also, it should be appreciated that the complementary stationary and movable closure mechanisms described with regard to the loadports 200, 300, 400, 500 can be used to precisely control a theta position/orientation of the port door 201. The theta position/orientation of the port door 201 is defined by an angle 214 (see coordinate axes in FIG. 2A) extending between the y and x reference directions in the x-y plane, i.e., in the horizontal plane. Proper theta position/orientation of the port door 201 ensures that both port door 201 latch keys, e.g., latch keys 60 of FIG. 1, are equally inserted into their corresponding container door receptacles. Proper theta position/orientation of the port door 201 also ensures that the container door latching means correctly engages with its associated recesses in the container shell. Precise theta position/orientation of the port door 201 can be achieved by adjusting the complementary stationary and movable closure mechanisms on one side of the port door 201 relative to the other side of the port door 201. For example, a position of the complementary stationary and movable closure mechanisms on one side of the port door 201 can be adjusted in the direction perpendicular to the frame 205, i.e., in the y reference direction, to adjust the theta position/orientation of the port door 201 relative to the frame 205.

Figure 7:
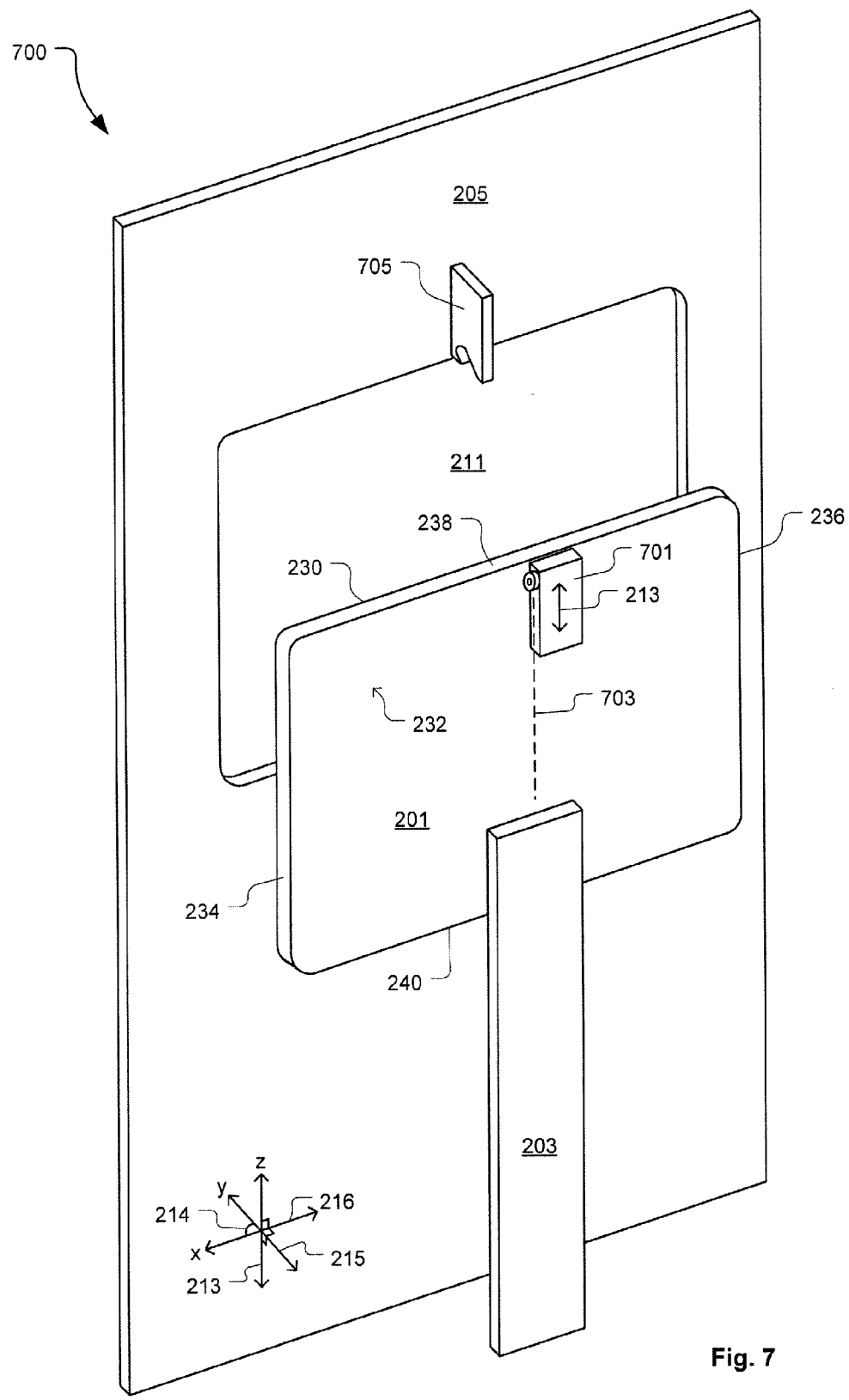
FIG. 7 shows a loadport that implements a single set of complementary stationary and movable closure mechanisms, in accordance with one embodiment of the present invention.

FIG. 7 shows a loadport 700 that implements a single set of complementary stationary and movable closure mechanisms 705/701, in accordance with one embodiment of the present invention. In this embodiment, a single movable closure mechanism 701 is connected to the back surface 232 of the port door 201, near the top horizontal side surface 238 of the port door 201, and on the vertical centerline 703 of the port door 201. A corresponding fixed single stationary closure mechanism 705 is mounted on the frame 205 to be engaged by the single movable closure mechanism 701. In an alternate embodiment, the single movable closure mechanism 701 can be mounted on the frame 205, and the single stationary closure mechanism 705 can be mounted on the back surface 232 of the port door 201. With the loadport 700 configuration, the closure driving motion of the single set of complementary stationary and movable closure mechanisms is coordinated with the horizontal drive of the positioning device 203 to provide for proper port door 201 closure.

In one embodiment the single movable closure mechanism 701 is defined as a roller that can be driven vertically, and the single stationary closure mechanism 705 is defined as a cam plate compatible to receive the roller, such that movement of the roller within and angled channel of the cam plate causes movement of the port door 201 in the direction perpendicular to the frame 205. In another embodiment the single movable closure mechanism 701 is defined as a cam plate that can be driven vertically, and the single stationary closure mechanism is defined as a roller compatible to received within the cam plate, such that movement of the cam plate with the roller positioned within an angled channel of the cam plate causes movement of the port door 201 in the direction perpendicular to the frame.

FIGS. 8A-8D illustrate operational sequences of the loadport 200, in accordance with one embodiment of the present invention. FIG. 8A shows a container 801 positioned on the loadport 200, with its container door 803 in the closed configuration. To open the container 801, the port door 201 is moved to interface with the container door 803. FIG. 8B shows the positioning device 203 moved vertically to position the port door 201 in vertical alignment with the frame 203 opening 211, to enable horizontal movement of the port door 201 through the opening 211. FIG. 8C shows the position device 203 moved horizontally to position the port door 201 within the opening 211, such that the rollers 206A/B of the movable closure mechanism 209A/B (connected to the port door 201) are positioned to engage the cam plate 209A/B of the stationary closure mechanism (connected to the frame 205).

FIG. 8D shows the movable closure mechanism 207A/B moved vertically such that the roller 206A/B moves through the channel of the cam plate 209A/B, thereby moving the port door 201 horizontally to interface with the container door 803. It should be understood that the positioning device 203 is controlled to hold the port door 201 in its vertical position as the port door 201 is moved through the opening 211 to interface with the container door 803. Also, it should be understood that the positioning device 203 is controlled to allow for horizontal movement of the port door 201 as directed by the complementary movable and stationary closure mechanisms 207A/B and 209A/B, respectively.

The sequence of operations described above with regard to FIGS. 8A-8D can be essentially reversed to remove the container door 803 from the container 801, with the container door 803 secured to the port door 201, e.g., by way of latch keys that extend from the port door 201 into the container door 803. Then, the sequence of operations described above with regard to FIGS. 8A-8D can be repeated to replace the container door 803 in its closed position within the container 801.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:
1. A loadport, comprising:
a port door having a front surface, a back surface, a top surface, a bottom surface, and first and second vertical side surfaces each extending between the top and bottom surfaces, wherein the front surface of the port door is defined to interface with a container door of a container for holding semiconductor workpieces, when present;
a frame defined to have an opening through which the port door interfaces with the container door;
a positioning device connected to the port door to provide for controlled positioning and movement of the port door;
a movable closure mechanism affixed to the back surface of the port door between the top and bottom surfaces of the port door the movable closure mechanism positioned separate from the positioning device, the movable closure mechanism including moveable portions extending outward in a horizontal direction beyond each of the first and second vertical side surfaces of the port door, the moveable portions of the movable closure mechanism defined to be movable in a controlled manner relative to both the port door and the frame; and
stationary closure mechanisms disposed on the frame proximate to the opening of the frame at locations to engage with the moveable portions of the movable closure mechanism when the port door is present within the opening of the frame,
wherein movement of the moveable portions of the movable closure mechanism to respectively engage with the stationary closure mechanisms applies a closing force between the front surface of the port door and the container door.

2. The loadport as recited in claim 1, wherein the closing force is directed in a substantially perpendicular direction between the front surface of the port door and the container door.

3. The loadport as recited in claim 1, wherein the positioning device is defined to move the port door in a vertical direction relative to the opening of the frame, and wherein the positioning device is defined to move the port door in a horizontal direction within the opening of the frame.

4. The loadport as recited in claim 1, wherein the movable portions of the movable closure mechanism are defined as a pair of guiding members that each extend outwardly beyond a respective one of the first and second vertical side surfaces of the port door at a position behind the back surface of the port door, wherein each of the pair of guiding members is defined to move in a substantially vertical direction relative to the port door and in a substantially simultaneous manner, and
wherein the stationary closure mechanisms are defined as a pair of cam plates respectively fixed proximate to the first and second vertical sides of the opening of the frame, wherein each of the pair of cam plates includes a channel formed to receive a respective one of the pair of guiding members, wherein each channel is defined to translate movement of the guiding member therein into a movement of the port door perpendicularly toward the container door so as to apply the closing force.

5. The loadport as recited in claim 4, further comprising:
a pair of drive plates to which the pair of guiding members are respectively connected;
a pair of drive tracks to which the pair of drive plates are respectively connected, each of the pair of drive tracks connected to the back surface of the port door and oriented to direct movement of the drive plate connected thereto in a substantially vertical direction;
a drive source defined to control movement of the pair of drive plates along their respective drive tracks; and
a mechanical linkage defined to translate work of the drive source into simultaneous movement of the pair of drive plates.

6. The loadport as recited in claim 5, wherein the mechanical linkage is defined as a motion transfer plate defined to move in a substantially horizontal direction relative to the port door, the motion transfer plate defined to engage each of the pair of drive plates, such that substantially horizontal movement of the motion transfer plate causes substantially equal and simultaneous vertical movement of each of the pair of drive plates and the pair of guiding members respectively connected to the pair of drive plates.

7. The loadport as recited in claim 6, wherein the drive source is a motor having a lead screw connected for rotation by the motor, wherein the motor is connected to the back surface of the port door at a fixed position, wherein a nut threaded in a complementary manner with the lead screw is connected to the motion transfer plate to receive the lead screw, wherein the lead screw and the nut are oriented in the substantially horizontal direction relative to the port door such the rotation of the lead screw within the nut moves the nut and motion transfer plate connected thereto in the substantially horizontal direction.

8. The loadport as recited in claim 6, wherein the drive source is a pneumatic cylinder having a drive rod connected thereto, wherein the pneumatic cylinder is connected to the back surface of the port door at a fixed position, wherein the drive rod is also connected to the motion transfer plate such that movement of the drive rod causes movement of the motion transfer plate in the substantially horizontal direction.

9. The loadport as recited in claim 1, wherein the stationary closure mechanisms are defined as a pair of guiding members respectively fixed proximate to first and second vertical sides of the opening of the frame, and
wherein the movable portions of the movable closure mechanism are defined as a pair of movable cam plates respectively disposed along the first and second vertical side surfaces of the port door at respective positions behind and outside the back surface of the port door, wherein each of the pair of movable cam plates is defined to move in a substantially vertical direction relative to the port door and in a substantially simultaneous manner, wherein each of the pair of movable cam plates includes a channel formed to receive a respective one of the pair of guiding members, wherein each channel is defined to translate movement of its movable cam plate against the guiding member therein into a movement of the port door perpendicularly toward the container door so as to apply the closing force.

10. The loadport as recited in claim 9, further comprising:
a pair of drive plates to which the pair of movable cam plates are respectively connected;
a pair of drive tracks to which the pair of drive plates are respectively connected, each of the pair of drive tracks connected to the back surface of the port door and oriented to direct movement of the drive plate connected thereto in a substantially vertical direction;
a drive source defined to control movement of the pair of drive plates along their respective drive tracks; and
a mechanical linkage defined to translate work of the drive source into simultaneous movement of the pair of drive plates.

11. The loadport as recited in claim 10, wherein the mechanical linkage is defined as a motion transfer plate defined to move in a substantially horizontal direction relative to the port door, the motion transfer plate defined to engage each of the pair of drive plates, such that substantially horizontal movement of the motion transfer plate causes substantially equal vertical movement of each of the pair of drive plates and the pair of movable cam plates respectively connected to the pair of drive plates.

12. The loadport as recited in claim 11, wherein the drive source is a motor having a lead screw connected for rotation by the motor, wherein the motor is connected to the back surface of the port door at a fixed position, wherein a nut threaded in a complementary manner with the lead screw is connected to the motion transfer plate to receive the lead screw, wherein the lead screw and the nut are oriented in the substantially horizontal direction relative to the port door such the rotation of the lead screw within the nut moves the nut and motion transfer plate connected thereto in the substantially horizontal direction.

13. The loadport as recited in claim 11, wherein the drive source is a pneumatic cylinder having a drive rod connected thereto, wherein the pneumatic cylinder is connected to the back surface of the port door at a fixed position, wherein the drive rod is also connected to the motion transfer plate such that movement of the drive rod causes movement of the motion transfer plate in the substantially horizontal direction.

14. The loadport as recited in claim 10, wherein the pair of movable cam plates are formed as respective portions of the pair of drive plates.

15. A loadport, comprising:
a port door having a front surface, a back surface, a top surface, a bottom surface, and first and second vertical side surfaces each extending between the top and bottom surfaces, wherein the front surface of the port door is defined to interface with a container door of a container for holding semiconductor workpieces, when present;

a frame defined to have an opening through which the port door interfaces with the container door;

a positioning device connected to the port door to provide for controlled positioning and movement of the port door;

a stationary closure mechanism affixed to the back surface of the port door between the top and bottom surfaces of the port door, the stationary closure mechanism positioned separate from the positioning device, the stationary closure mechanism including fixed portions extending outward beyond each of the first and second vertical side surfaces of the port door; and movable closure mechanisms disposed on the frame proximate to the opening of the frame at locations to engage with the fixed portions of the stationary closure mechanism when the port door is present within the opening of the frame, the movable closure mechanisms defined to be movable in a controlled manner relative to both the frame and the port door, wherein movement of the movable closure mechanisms to engage with the fixed portions of the stationary closure mechanism applies a closing force between the front surface of the port door and the container door.

16. The loadport as recited in claim 15, wherein the closing force is directed in a substantially perpendicular direction between the front surface of the port door and the container door.

17. The loadport as recited in claim 15, wherein the positioning device is defined to move the port door in a vertical direction relative to the opening of the frame, and wherein the positioning device is defined to move the port door in a horizontal direction within the opening of the frame.

18. The loadport as recited in claim 15, wherein fixed portions of the stationary closure mechanism are defined as a pair of guiding members that each extend outwardly beyond a respective one of the first and second vertical side surfaces of the port door at a position behind the back surface of the port door, and wherein the movable closure mechanisms are defined as a pair of movable cam plates respectively disposed proximate to the first and second vertical sides of the opening of the frame, wherein each of the pair of cam plates is defined to move in a substantially vertical direction relative to both the frame and the port door and in a substantially simultaneous manner, wherein each of the pair of movable cam plates includes a channel formed to receive a respective one of the pair of guiding members, wherein each channel is defined to translate movement of its movable cam plate against the guiding member therein into a movement of the port door perpendicularly toward the container door so as to apply the closing force.

19. The loadport as recited in claim 18, further comprising:

a pair of drive plates to which the pair of movable cam plates are respectively connected;

a pair of drive tracks to which the pair of drive plates are respectively connected, each of the pair of drive tracks connected to the frame and oriented to direct movement of the drive plate connected thereto in a substantially vertical direction;

a drive source defined to control movement of the pair of drive plates along their respective drive tracks; and a mechanical linkage defined to translate work of the drive source into simultaneous movement of the pair of drive plates.

20. The loadport as recited in claim 19, wherein the mechanical linkage is defined as a motion transfer plate defined to move in a substantially horizontal direction relative to the frame, the motion transfer plate defined to engage each of the pair of drive plates, such that substantially horizontal movement of the motion transfer plate causes substantially equal and simultaneous vertical movement of each of the pair of drive plates and the pair of movable cam plates respectively connected to the pair of drive plates.

21. The loadport as recited in claim 20, wherein the drive source is a motor having a lead screw connected for rotation by the motor, wherein the motor is connected to the frame at a fixed position, wherein a nut threaded in a complementary manner with the lead screw is connected to the motion transfer plate to receive the lead screw, wherein the lead screw and the nut are oriented in the substantially horizontal direction relative to the frame such the rotation of the lead screw within the nut moves the nut and motion transfer plate connected thereto in the substantially horizontal direction.

22. The loadport as recited in claim 20, wherein the drive source is a pneumatic cylinder having a drive rod connected thereto, wherein the pneumatic cylinder is connected to the frame at a fixed position, wherein the drive rod is also connected to the motion transfer plate such that movement of the drive rod causes movement of the motion transfer plate in the substantially horizontal direction.

23. The loadport as recited in claim 19, wherein the pair of movable cam plates are formed as respective portions of the pair of drive plates.

24. The loadport as recited in claim 15, wherein the movable closure mechanisms are defined as a pair of guiding members respectively disposed proximate to first and second vertical sides of the opening of the frame, each of the pair of guiding members defined to move in a substantially vertical direction in a substantially simultaneous manner, and wherein the fixed portions of the stationary closure mechanism are defined as a pair of cam plates respectively fixed along the first and second vertical side surfaces of the port door at respective positions behind and outside the back surface of the port door, wherein each of the pair of cam plates includes a channel formed to receive a respective one of the pair of guiding members, wherein each channel is defined to translate movement of the guiding member therein into a movement of the port door perpendicularly toward the container door so as to apply the closing force.

25. The loadport as recited in claim 24, further comprising:

a pair of drive plates to which the pair of guiding members are respectively connected;

a pair of drive tracks to which the pair of drive plates are respectively connected, each of the pair of drive tracks connected to the frame and oriented to direct movement of the drive plate connected thereto in a substantially vertical direction;

a drive source defined to control movement of the pair of drive plates along their respective drive tracks; and a mechanical linkage defined to translate work of the drive source into simultaneous movement of the pair of drive plates.

26. The loadport as recited in claim 25, wherein the mechanical linkage is defined as a motion transfer plate defined to move in a substantially horizontal direction relative to the frame, the motion transfer plate defined to engage each of the pair of drive plates, such that substantially horizontal movement of the motion transfer plate causes substantially equal vertical movement of each of the pair of drive plates and the pair of guiding members respectively connected to the pair of drive plates.

27. The loadport as recited in claim 26, wherein the drive source is a motor having a lead screw connected for rotation by the motor, wherein the motor is connected to the frame at a fixed position, wherein a nut threaded in a complementary manner with the lead screw is connected to the motion transfer plate to receive the lead screw, wherein the lead screw and the nut are oriented in the substantially horizontal direction relative to the frame such the rotation of the lead screw within the nut moves the nut and motion transfer plate connected thereto in the substantially horizontal direction.

28. The loadport as recited in claim 26, wherein the drive source is a pneumatic cylinder having a drive rod connected thereto, wherein the pneumatic cylinder is connected to the frame at a fixed position, wherein the drive rod is also connected to the motion transfer plate such that movement of the drive rod causes movement of the motion transfer plate in the substantially horizontal direction.

\* \* \* \* \*